(12) United States Patent
Rinne et al.

(10) Patent No.: US 12,160,232 B2
(45) Date of Patent: *Dec. 3, 2024

(54) LOW-LATENCY SWITCH DRIVE CIRCUIT WITH POWER TRANSFER

(71) Applicant: Allegro MicroSystems, LLC, Manchester, NH (US)

(72) Inventors: Karl Rinne, Cork (IE); Joseph Duigan, Peymeinade (FR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/351,760

(22) Filed: Jul. 13, 2023

(65) Prior Publication Data

US 2023/0353145 A1    Nov. 2, 2023

Related U.S. Application Data

(63) Continuation of application No. 17/560,969, filed on Dec. 23, 2021, now Pat. No. 11,764,778, which is a
(Continued)

(30) Foreign Application Priority Data

Oct. 6, 2017    (GB) ...................................... 1716437

(51) Int. Cl.
*H03K 17/691*    (2006.01)
*H02M 1/08*    (2006.01)
(Continued)

(52) U.S. Cl.
CPC ............ *H03K 17/691* (2013.01); *H02M 1/08* (2013.01); *H02M 3/33523* (2013.01); *H02M 3/33576* (2013.01); *H02M 1/4233* (2013.01)

(58) Field of Classification Search
CPC .. H03K 17/691; H02M 1/08; H02M 3/33576; H02M 2001/0006; H02M 3/33584;
(Continued)

(56) References Cited

U.S. PATENT DOCUMENTS 4,461,966 A    7/1984 Hebenstreit
4,748,351 A    5/1988 Barzegar
(Continued)

FOREIGN PATENT DOCUMENTS

DE          3700488 A1    7/1988
DE    10 2004 033 125 A1    2/2006
(Continued)

OTHER PUBLICATIONS

Chinese Office Action dated Feb. 21, 2023 (with English translation) for Chinese Patent Application No. 201880075574.1; 21 pages.
(Continued)

*Primary Examiner* — Jung Kim
(74) *Attorney, Agent, or Firm* — Daly, Crowley, Mofford & Durkee, LLP

(57)    ABSTRACT

Switch drive circuits include galvanically isolated switch circuits with power transfer from the switch driver input side to the switch side. A switch drive circuit uses a single transformer to transfer control signals to a secondary side for control of the switch along with power to a secondary side circuit to drive the switch in response to the control signals. By detecting the control signal first before drawing current, the effects of leakage inductance in the transformer are reduced.

2 Claims, 16 Drawing Sheets

Related U.S. Application Data continuation of application No. 16/753,329, filed as application No. PCT/EP2018/077333 on Oct. 8, 2018, now Pat. No. 11,211,929.

(51) Int. Cl.
*H02M 3/335* (2006.01)
*H02M 1/42* (2007.01)

(58) Field of Classification Search
CPC ......... H02M 2001/007; H02M 1/4233; H02M 3/33523; Y02B 70/10
See application file for complete search history.

(56) References Cited

U.S. PATENT DOCUMENTS

| | | | |
|---|---|---|---|
| 4,970,420 A | 11/1990 | Billings | |
| 5,019,719 A | 5/1991 | King | |
| 5,051,609 A | 9/1991 | Smith | |
| 5,430,613 A | 7/1995 | Hastings et al. | |
| 5,598,135 A | 1/1997 | Maeda et al. | |
| 5,847,631 A | 12/1998 | Taylor et al. | |
| 5,959,846 A | 9/1999 | Noguchi et al. | |
| 6,107,860 A | 8/2000 | Vinciarelli | |
| 6,181,130 B1 | 1/2001 | Hoshi et al. | |
| 6,281,560 B1 | 8/2001 | Allen et al. | |
| 6,377,155 B1 | 4/2002 | Allen et al. | |
| 6,775,901 B1 | 8/2004 | Lee et al. | |
| 6,791,851 B2 | 9/2004 | Brkovic | |
| 7,023,315 B2 | 4/2006 | Yeo et al. | |
| 7,119,448 B1 | 10/2006 | de Stasi | |
| 7,173,835 B1 | 2/2007 | Yang | |
| 7,663,351 B2 | 2/2010 | Korsunsky | |
| 7,719,112 B2 | 5/2010 | Shen | |
| 7,804,697 B2 | 9/2010 | Melanson | |
| 7,868,431 B2 | 1/2011 | Feng et al. | |
| 8,063,689 B2 | 11/2011 | Theiler | |
| 8,094,458 B2 | 1/2012 | Furnival | |
| 8,217,748 B2 | 7/2012 | Feng et al. | |
| 8,680,837 B2 | 3/2014 | Zeng et al. | |
| 8,816,666 B2 | 8/2014 | Kimura et al. | |
| 9,048,020 B2 | 6/2015 | Calvillo Cortes et al. | |
| 9,660,584 B2 | 5/2017 | Modi et al. | |
| 9,743,523 B2 | 8/2017 | Huang et al. | |
| 9,847,166 B2 | 12/2017 | Kneller | |
| 9,887,034 B2 | 2/2018 | Francis | |
| 9,899,140 B2 | 2/2018 | Kneller et al. | |
| 9,922,764 B2 | 3/2018 | Kneller et al. | |
| 9,948,294 B2 | 4/2018 | Peter et al. | |
| 10,002,703 B2 | 6/2018 | Wang et al. | |
| 10,014,798 B1 | 7/2018 | Vinciarelli | |
| 10,062,495 B2 | 8/2018 | Lloyd | |
| 10,176,917 B2 | 1/2019 | Parish et al. | |
| 10,217,558 B2 | 2/2019 | Kneller | |
| 10,224,143 B2 | 3/2019 | Kneller et al. | |
| 10,229,779 B2 | 3/2019 | Harber | |
| 10,234,513 B2 | 3/2019 | Vig et al. | |
| 10,256,027 B2 | 4/2019 | Li et al. | |
| 10,319,509 B2 | 6/2019 | Kneller et al. | |
| 10,347,413 B2 | 7/2019 | Francis | |
| 10,573,457 B2 | 2/2020 | Wang et al. | |
| 10,811,181 B2 | 10/2020 | Parish et al. | |
| 10,930,422 B2 | 2/2021 | Francis | |
| 11,139,102 B2 | 10/2021 | Kneller et al. | |
| 11,201,619 B2 | 12/2021 | Rinne et al. | |
| 11,211,929 B2 * | 12/2021 | Rinne ............... H02M 3/33523 |
| 2009/0147544 A1 | 6/2009 | Melanson | |
| 2009/0237899 A1 | 9/2009 | Furnival | |
| 2012/0008344 A1 | 1/2012 | Zeng et al. | |
| 2012/0206171 A1 | 8/2012 | Kimura et al. | |
| 2013/0293268 A1 | 11/2013 | Draxelmayr et al. | |
| 2016/0181004 A1 | 6/2016 | Li et al. | |

FOREIGN PATENT DOCUMENTS

| | | | |
|---|---|---|---|
| GB | 2 250 383 A | 6/1992 | |
| GB | 2 341 288 A | 3/2000 | |
| JP | H01300617 A | 12/1989 | |
| JP | 2001 167941 A | 6/2001 | |
| JP | 2003 234234 A | 8/2003 | |
| JP | 2008 072021 A | 3/2008 | |
| WO | WO 93/21690 33 | 10/1993 | |
| WO | WO 95/12247 14 | 5/1995 | |
| WO | WO 2009/008739 A1 | 1/2009 | |
| WO | WO 2010/061281 A2 | 6/2010 | |
| WO | WO 2011/137845 A1 | 11/2011 | |

OTHER PUBLICATIONS

Bourgeois, "An Isolated Gate 25 Drive For Power MOSFETs and IGBTs", STMicroelectronics Group, AN461/0194, 1999; 7 pages.
"ADuM4135 Data Sheet, Single-/Dual-Supply, High Voltage Isolated IGBT Gate Driver with Miller Clamp", Analog Devices Inc., Rev. E, 2015; 17 pages.
"Si827x", Datasheet Rev. 0.5, Silicon Laboratories Inc., 2016; 43 pages.
Great Britain Search Report dated Apr. 6, 2018, for Great Britain Patent Application No. GB1716437.7; 7 pages.
PCT International Search Report and Written Opinion dated Mar. 15, 2019, for International Application No. PCT/EP2018/077333; 21 pages.
Response to Chinese Office Action dated Feb. 21, 2023 (with English translation) for Chinese Patent Application No. 201880075574. 1; Response filed Jul. 6, 2023; 13 pages.
Chinese Office Action (w/English translation) dated Dec. 19, 2023, for Chinese Patent Application No. 201880075574.1; 19 pages.
Chinese Office Action (w/English translation) dated Apr. 2, 2024, for Chinese Patent Application No. 201880075574.1; 20 pages.

* cited by examiner

LOW-LATENCY SWITCH DRIVE CIRCUIT WITH POWER TRANSFER

CROSS-REFERENCE TO RELATED APPLICATIONS

This application is a continuation of, and claims priority benefit of, U.S. patent application Ser. No. 17/560,969, filed Dec. 23, 2021 by Karl Rinne et al. and titled "Low-Latency Switch Drive Circuit With Power Transfer," which is a continuation of, and claims priority benefit of, U.S. patent application Ser. No. 16/753,329, filed Apr. 2, 2020 by Karl Rinne et al. and titled "Galvanically isolated low-latency switch drive circuit with power transfer" (which issued as U.S. Pat. No. 11,211,929 on Dec. 28, 2021), which is a national-phase filing of, and claims priority benefit of, PCT Patent Application No. PCT/EP2018/077333, filed Oct. 8, 2018 by Karl Rinne et al. and titled "Galvanically isolated low-latency switch drive circuit with power transfer," which claims priority benefit of Great Britain Patent Application No. GB 1716437.7, filed Oct. 6, 2017 by Karl Rinne et al. and titled "Galvanically isolated low-latency switch drive circuit with power transfer": each of which applications is incorporated herein by reference in its entirety.

FIELD OF THE APPLICATION

The present application relates to electronics and in particular to switch drive circuits and more particularly to galvanically isolated switch circuits with power transfer from the switch driver input side to the switch side.

BACKGROUND

In the field of power electronics, switch drive circuits are used to turn switches on and off.

Switches are commonly used in a wide variety of electronic system. Switches usually control the flow of current from a power source to a load. In contrast to controlled resistive devices used for example in linear amplifiers and linear regulators, switches are usually either turned on completely (reaching their lowest ON-state resistance), or turned off completely (reaching their highest OFF-state resistance). The controlling electrode of the switch, usually referred to as its gate (or base), is driven by a switch drive circuit, or sometimes also referred to as gate drive circuit. Switches are usually voltage-controlled, turning on when the gate voltage (relative to another electrode of the switch usually referred to as its source or emitter) exceeds a manufacturer-specific threshold voltage by a margin, and turning off when the gate voltage remains below the threshold voltage by a margin. The present invention mainly targets the drive of these voltage-controlled switches such as metal-oxide-semiconductor field effect transistors (MOSFET), Silicon Carbide (SiC) transistors, Gallium Nitride (GaN) transistors, or insulated-gate bipolar transistors (IGBT), but may also be used to drive the less common current-controlled switches such as bipolar junction transistors (BJT), or gate-injection transistors (GIT). Switch drive circuits receive their control instructions from a controller such as a pulse-width-modulated (PWM) controller via one or more switch driver inputs. Switch drive circuits deliver their drive signals directly (or indirectly via networks of active and passive components) to the respective terminals of the switch (gate and source).

Key performance parameter of switch driver circuits include their capability to drive switches with low propagation delay in the presence of non-ideal switch parameters such as input gate capacitances and presence of parasitic negative feedback (e.g., Miller effect).

Switches are often employed in electronic systems where galvanic isolation must be used to prevent undesirable DC currents flowing from one side of an isolation barrier to the other. Galvanic isolation is commonly used to separate circuits in order to protect users from coming into direct contact with hazardous voltages. Galvanic isolation may also be used to intentionally separate electrical circuits with hazardous or safe voltages on both sides of the isolation barrier, in order to simplify circuit design, reduce cost or improve system performance.

It is a common situation that the control circuit and thus the switch driver inputs reside on one side of the galvanic isolation barrier, while the switch driven by the switch driver resides on the other side of the isolation barrier. In other words, the switch drive circuit crosses the isolation barrier, and hence often becomes a safety-critical component. Various transmission techniques are available for signals to be sent across galvanic isolation barriers including optical, magnetic and capacitive coupling techniques. The present invention targets galvanically isolated switch drive circuits which transmit drive signal information across isolation barriers using magnetic coupling.

It is a common situation that both the controller as well as the switch driver input is referenced to a reference node at one side of the isolation barrier. This first reference node is called "primary ground" throughout this document and illustrated using a ground symbol L with an attached label "P" in various figures. The switch driver output reference node as well as the switch's reference electrode are joined at the other side of the isolation barrier and referred to as "floating ground" throughout this document, and illustrated using a ground symbol L with an attached label "F" in various figures. If multiple switches are to be driven in a more complex electronic system, multiple distinct floating ground nodes may exist (often one per switch), while typically only one primary ground node is required in the system.

It is also well known that isolated switch drive circuits may also be advantageously employed in electronic systems where galvanic isolation is not actually strictly required. In those cases, the galvanic isolation feature of the switch drive circuit may simplify the circuit design where "floating switches" (i.e., switches with their reference electrode not connected to the controller ground) need to be driven. Floating switches are also sometimes referred to as "high side switches". The present galvanically isolated switch drive circuit may also be used to drive floating switches and may be referred to as a "floating switch drive circuit" or "floating gate drive circuit" in those systems.

FIG. 1 illustrates the situation regarding switch arrangements in a modern high-efficiency multi-stage Switch-Mode Power Converter (SMPC) used in the on-board battery-charger of a modern electric vehicle (EV), serving as an example of the application for isolated switch drive circuits. An input section receives the AC input and provides surge and fuse protection and EMI filtering. The Switch-Mode Power Converter is arranged as a totem pole power factor correction (PFC) stage which converts the input AC voltage to a DC voltage. This DC voltage is then provided as an input to an isolated DC-DC switching stage which charges the batteries. The isolation in the DC-DC switching stage is provided by a transformer 130. This isolation, it will be appreciated, is galvanic isolation.

A total of eight switches 140-147 are required on the primary side of the of the transformer, and a total of six switches 148-153 need to be driven on the secondary side of the isolation barrier. Of the eight primary side switches, four are referenced to the primary side ground (141, 143, 145, 147), while the remaining four are floating switches (140, 142, 144, 146). Of the six switches on the secondary side (148-153), none is referenced to the primary side ground. Thus, for a total of fourteen switches, thirteen switch drive circuits are required (152 and 153 are back-to-back protection switches which can be driven by a single switch driver 161). All switches are controlled by a controller 160 residing on the primary side and referenced to primary side ground. As illustrated, the usage of galvanically isolated switch drive circuits 162 in all instances greatly simplifies system design as they are capable of driving each of the switches regardless which side of the isolation barrier they are located, and regardless of whether the switches are floating with respect to ground or not. Only one type of switch drive circuit is required, reducing design time, cost and the streamlining the system's bill-of-material.

PRIOR ART

Galvanically isolated switch drive circuits have been used for a long time, and a variety of prior art solutions exist.

FIG. 2 shows a transformer-based galvanically isolated switch drive circuit driving switch 104. Transformer 101 is operated at the switching frequency of the switch, and directly transmits the required gate-source voltage from the primary side to the floating side. The switch drive voltages are directly applied to the transformer primary and secondary coils. Magnetic flux in the transformer core is proportional to the time-integral of voltage applied to the coil. For typical switching frequencies and drive voltages, the magnetic flux swing is large, which translates into undesirably large transformer size and volume. Losses in the drive transformer are also large. As the switch's gate capacitance is charged by the primary side through the transformer at turn-on, and the gate current needs to ramp up to significant levels, the transformer's leakage inductances become a performance-limiting factor. The larger the transformer leakage inductances, the slower the rate of change of current, and hence the larger the propagation delay to turn switch 104 on and off. The volt-second product across the transformer coils further imposes upper limits in terms of switch ON times, and switch OFF times, translating into lower limits to the switching frequency. Further, the ratio of ON time, to the sum of ON and OFF times (often referred to as the duty cycle) is limited by the transformer. While the solution may be adequate for applications operating near 50% duty cycle, performance deteriorates substantially at very low or very large duty cycles. The prior art solution is often somewhat enhanced on the floating side by active or passive networks as shown in FIG. 2 involving components 102 and 103 accelerating the turn-off time of switch 104. As is also illustrated in FIG. 2, the floating side circuitry is quite simple and usually doesn't require any additional supply voltages.

FIG. 3 shows an alternative galvanically isolated switch drive circuit using an optical barrier device, usually referred to as an optocoupler. The optocoupler 121 is driven by a primary opto drive circuit 120 through modulation of the current through the optocoupler's light-emitting diode (LED). On the floating side the incoming signal is demodulated and converted into suitable drive signals for the power switch 125 to be driven. The floating side circuit requires a separate floating supply normally provided by a separate DC-to-DC converter 122, which itself crosses the isolation barrier. The DC-to-DC converter adds cost and complexity to the solution. Poor propagation delays of optocouplers limit the application of this drive circuit to relatively low-frequency switch drive applications. Deterioration of the electrical performance of optocouplers over time reduces the lifetime of products based on optocouplers to low values (around 15 years or less typically) which may be sufficient for some consumer products but insufficient for industrial or high-reliability systems.

FIG. 4 shows another transformer-based galvanically isolated switch driver, commercially available from various vendors (for example such an approach is provided in Analog Devices Inc., Datasheet "ADuM4135 Single-/Dual-Supply, High Voltage Isolated IGBT Gate Driver with Miller Clamp", Rev. B, 2015 hereinafter referred to as Ref. 1). In contrast to the previously discussed FIG. 2, transformer 111 is operated at a carrier frequency substantially higher than the switching frequency, usually by one or two orders of magnitude. Operation at high carrier frequency helps to reduce the size of the transformer and supports its integration with the primary and floating-side switch circuit. Due to the fact that only signals are transferred through transformer 111, the achievable propagation delay through the driver is low, and the gate drive circuit is suitable for high-frequency switching applications. The floating side of the isolated driver requires operating power which typically needs to be provided through a separate DC-to-DC converter 112 adding extra cost and complexity. The power efficiency of signal transfer is reduced because of the high carrier frequencies required, leading to power losses in primary side and floating side circuits as well as in the transformer.

FIG. 5 shows a capacitively-coupled galvanically isolated switch driver, which is commercially available from a variety of manufacturers (for example as described in Silicon Laboratories Inc., Datasheet "Si827x", Rev. 0.5, 2016, hereinafter referenced as Ref. 2). Switch state information is transferred from the primary side circuit to the floating side circuit of the switch driver using a forward capacitor 131 and a return capacitor 132. Two capacitors are required for a closed AC current loop. The primary side circuits inject modulated high-frequency currents into the capacitors, while the floating side receives and demodulates the currents and creates suitable switch drive signals. The capacitors block DC currents thereby ensuring galvanic isolation. The capacitors may be small in value and size but need to be able to sustain potentially large static and dynamic voltages across the capacitor's dielectric. While the achievable propagation delay figures of the switch driver can be low, the power efficiency of signal transfer is also low. The capacitors may be package-integrated with the primary and floating side circuits to form an attractive co-packaged galvanically isolated switch driver. The floating side circuit requires electrical power in order to function, and this power must be provided either from the primary side by a separate DC-to-DC converter 136 adding cost and complexity, or alternatively from the floating side using bootstrap circuits or similar.

U.S. Pat. No. 4,461,966 by Hebenstreit, hereinafter referenced as Ref. 3, describes a transformer-coupled galvanically isolated switch driver, with a transformer using a single primary and a single secondary coil. The primary circuit capacitively couples a drive pulse. The floating side of the switch driver couples a charge pulse stemming from the primary side through a diode to the gate of the switch to be driven, facilitating the switch turn-on. The switch's input gate capacitance forms a bilateral storage element leaving the switch turned on after the turn-on pulse terminates. Through a circuit network the floating side of the switch driver facilitates a discharge of the gate capacitance of the switch at the turn-off event communicated from the primary circuit through a pulse of opposite polarity. The transformer can be small as only pulses need to be transmitted across the isolation barrier. The turn-on behavior is relatively slow, as the gate capacitance of the switch needs to be charged through the transformer, with the transformer's leakage inductance opposing rapid changes in gate charge current. The propagation delay of the gate driver is relatively large limiting the usefulness of the circuit to low switching frequency applications. Components such as the primary side coupling capacitor, as well as floating side forward diodes as well as Zener diodes hamper integration of these components on to modern CMOS processes. An advantage of the circuit is that the floating side circuit does not require any additional supply voltages. Another advantage of the circuit is the simplicity of transformer structure having only two coils. The major disadvantage of the circuit is that its performance is very sensitive to the transformer leakage inductance and leakage inductance variations.

U.S. Pat. No. 4,748,351, by Barzegar, (hereinafter referenced as Ref 4.) also describes a transformer-coupled galvanically isolated switch driver with dual floating side drive path for turn-on and turn-off of the switch. In contrast to Ref. 3 a more complicated transformer structure is required (two floating side coils), but simplifications in terms of floating side circuit complexity can be achieved. The drive circuit shares all disadvantages relating to transformer leakage inductance with Ref. 3. Due to the more complex transformer structure, package-integration of the transformer is also more challenging.

U.S. Pat. No. 4,970,420 by Billings (hereinafter referred to as Ref. 5) is similar to Ref. 3 in terms of simplicity of the transformer structure but avoids Zener diodes at the expense of a normally-ON gate discharge device. It shares the disadvantages of both Ref. 3 and Ref. 4 regarding the previously discussed turn-on propagation delays caused by transformer leakage inductance.

U.S. Pat. No. 5,019,719, by King (hereinafter referred to as Ref. 6) also describes a transformer-coupled galvanically isolated switch driver. In contrast to previously discussed solutions, Ref. 6 employs a floating-side charge pump consisting of two capacitors. By using a charge-pump, the switch turn-on delay usually caused by the transformer's leakage inductances can be substantially reduced. The transformer operates at the switching frequency of the main switch. A significant drawback of Ref. 6 is the large time-integral of voltage across the transformer coils as not only short pulses are transmitted. As a result, the required transformer size is substantially increased resulting in large transformer sizes comparable to FIG. 1. The transformer does not lend itself well to package-integration.

U.S. Pat. No. 6,107,860, by Vinciarelli, hereinafter referred to as Ref. 7, describes a transformer-coupled galvanically isolated switch driver. The primary side circuit of the switch driver transmits pulses to the floating side. As a result, the transformer is kept simple (using only two coils) and small (due to low time-integral of coil voltages). Turn-on and turn-off pulses are transmitted through the pulse transformer in an alternating fashion. Thus, the transformer operates at twice the switching frequency of the main switch. As is the case with Ref. 3 and similar solutions, the transformer leakage inductance causes turn-on delays and thus limits the performance of the switch driver. Another disadvantage of Ref. 7 includes the risk that primary side drive circuit and floating side drive circuit may get out of synchronization due to toggling action and potential ambiguity of interpretation of pulses arriving at the floating side of the driver. This risk can be addressed by additional circuitry at the expense of cost and complexity.

STMicroelectronics Group, J. M. Bourgeois, Application Note "An Isolated Gate Drive For Power MOSFETs and IGBTs", AN461/0194, 1999 (hereinafter referred to as Ref. 8) presents a discrete transformer-coupled galvanically isolated switch driver. The operating principle is quite similar to Ref. 3. A simple two-coil pulse transformer transmits pulses from the primary side to the floating side. The circuit utilizes the gate capacitance of the driven switch to act like a bilateral storage device. As a result, the switching frequency cannot drop below a certain lower limit in the presence of gate leakage currents. As is the case with most of the previously discussed circuits with the exception of Ref. 6, the turn-on performance is limited by the pulse transformer's leakage inductance. This limitation imposes an upper switching frequency limit. An added benefit of Ref. 8 is the added short-circuit protection for the switch.

SUMMARY

The present application provides a galvanically isolated switch drive circuit transmitting switch state information as well as powering the circuitry on the floating side of the isolation barrier. It uses a single magnetic coupling device to achieve both signal as well as power transfer. The magnetic coupling device is a transformer with a simple structure, coupling a single first coil and a single second coil preferably using a suitable magnetically active material such as ferrite in order to achieve good coupling between the coils. The transformer can be very compact in cross-sectional area and size as only short-duration pulses are transmitted minimizing the volt-second product across the coils. Signal and power transfer across the isolation barrier are achieved in a way that the power transfer is scheduled so as not to slow down signal transfer. The speed of signal transfer is not sensitive to imperfections in the transformer, such as transformer leakage inductances, and variations in magnetizing inductance.

As the transformer can be very compact in size, and the performance of the switch drive circuit is insensitive to the transformer leakage inductance, the transformer lends itself well to full integration into a single component package together with the primary and floating side of the switch drive circuit.

The floating side drive circuit remains in control of the switch drive and may inhibit switch drive independently of the primary side, for example during fault conditions detected on the floating side. Floating side fault conditions may include situations where the floating side supply voltage drops below a safe value, or operating temperature reach values outside safe limits, or switch currents exceed set current limits. The floating side drive circuit may also optionally regulate the switch drive voltage in order to provide well-controlled drive voltages independent of circuit parameter variations.

The floating side drive circuit includes a clock recovery circuit as well as a synchronous finite state machine (FSM). The clock recovery circuit extracts the anisochronous clock events from the incoming stream of pulses, and the synchronous FSM ensures that clean state transitions are executed at clearly defined points in time. Floating side control based on the synchronous FSM leads to a much more robust and scalable solution compared to asynchronous techniques. Either simple or alternatively more complex pulse patterns can be generated by the primary side drive circuit, transferred and fed into and handled by the FSM. Pulses transmitted by the primary side may optionally be width-modulated or amplitude-modulated in order to transmit additional information from the primary side drive circuit to the floating-side drive circuit.

For an orderly system start-up, prior to assuming normal operation, it is possible for the switch drive circuit to establish a safe floating side operating voltage by transmitting a sequence of OFF signal pulses. After one or more of these start-up OFF pulses, the floating circuit operating voltage reaches a suitable value following which normal switch drive operation can commence.

By employing refresh circuitry on the primary side, the switch drive circuit described here is also suitable for applications which require switches to be driven at very low switching frequencies, and all the way down to static ON or OFF operation of the switch.

More particularly, a first embodiment of the present application provides an isolated drive circuit for controlling the operation of a switch using a single transformer having a primary winding and a secondary winding. The isolated drive circuit comprises a control circuit for switching the switch in response to control signals delivered as pulses from the secondary winding of the transformer, a power supply circuit for providing power for the control circuit. The power supply circuit extracts power from individual pulses from the secondary winding of the transformer. However, the power supply circuit is configured to delay substantive extraction of power from individual pulses to allow the control circuit to detect the pulse. In this context, the power supply circuit may be configured to delay extraction of power until the amplitude of the pulse has reached a pre-determined level. At least one switch may be positioned after the secondary winding of the transformer for switchably connecting the winding to the power supply circuit. The at least one switch may be a diode or a transistor.

A second embodiment provides an isolated drive circuit for controlling the operation of a switch in response to bipolar pulse signals delivered from a primary winding of a transformer to a secondary winding of the transformer, the drive circuit comprising a pulse rectifier circuit for converting negative pulses received to be a first control signal and positive pulses received to be a second control signal wherein the first and second control signals are unipolar with respect to a common voltage reference. The secondary winding of the transformer suitably comprises a first output node and a second output node with the pulse rectifier circuit comprising a first switch for connecting the second output node to the common voltage reference, wherein the first switch is responsive to a voltage presented at the first node. A second switch is provided for connecting the first output node to the common voltage reference, wherein the second switch is responsive to a voltage presented at the second node.

A third embodiment provides an isolated drive circuit for controlling the operation of a switch using pulses delivered from a primary side winding to a secondary side winding of a transformer, the circuit comprising a control circuit wherein the control circuit is configured to extract a clock signal from the delivered pulses and to effect synchronous control of the switch using said extracted clock signal for timing. The synchronous control may operate based on transitions of delivered pulses.

A fourth embodiment provides an isolated drive circuit for controlling the operation of a switch by means of pulses delivered using a transformer, the circuit comprising a control circuit wherein the control circuit is configured to control the switch in response to the detection of a transition of a delivered pulse; a demodulator for extracting information from the pulses for use by the control circuit. The demodulator may extract information presented as amplitude in the pulses. The information extracted may be employed to set a parameter within the control circuit.

A fifth embodiment provides an isolated drive circuit for controlling the operation of a switch by delivering bipolar pulse signals from a primary winding of a transformer to a secondary winding of the transformer. Each bipolar signal, it will be appreciated, has a positive pulse and a negative pulse. The isolated drive circuit is configured to selectively generate bipolar pulses commencing with either a positive or a negative pulse. At the same time, the isolated drive circuit comprises a control circuit which is responsive to the order of the arrival of the positive and negative pulses within a unipolar pulse in controlling the operation of the switch.

A sixth embodiment provides an isolated drive circuit for delivering pulses using a primary side winding of a transformer to a control circuit connected to a secondary side winding of the transformer to effect control of a switch and for delivering power to a power supply on the secondary side for the control circuit, the isolated drive circuit comprising a modulator responsive to auxiliary control information for modulating the pulses delivered with the auxiliary control information.

BRIEF DESCRIPTION OF THE DRAWINGS

These and other embodiments will become apparent from the description which follows and the accompanying drawings in which.

DETAILED DESCRIPTION

Figure 1:
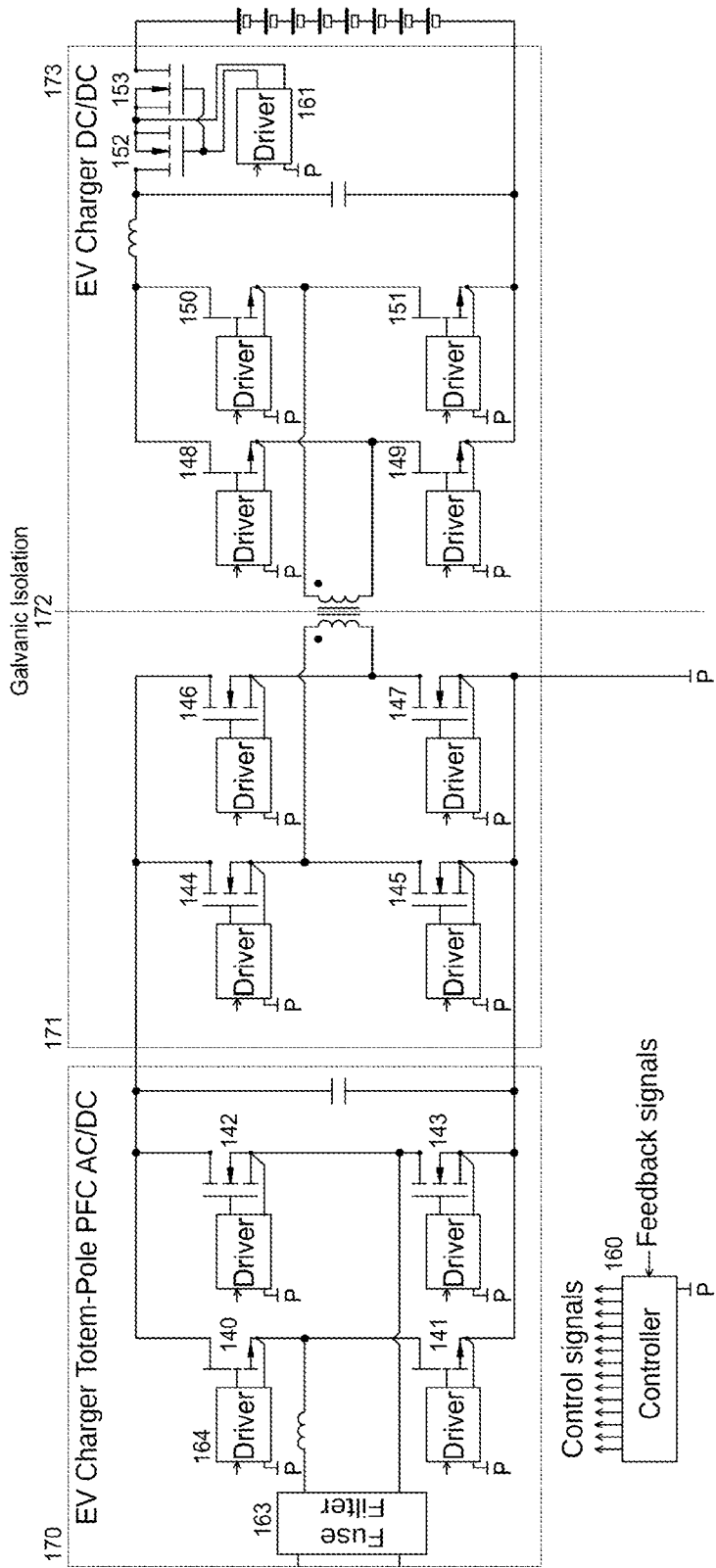
FIG. 1 provides a typical example system schematic employing a variety of switches on the primary and secondary side of an isolation barrier.
Figure 2:
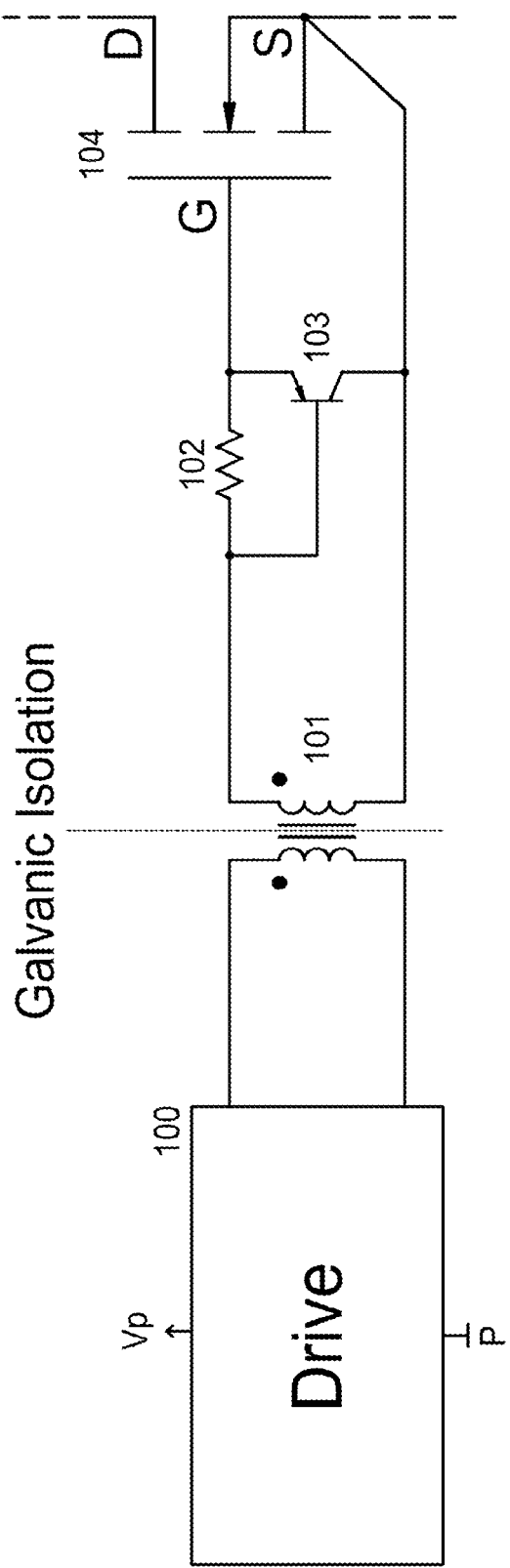
FIG. 2 shows a prior-art transformer-based galvanically isolated switch drive circuit with the transformer operating at the switching frequency.
Figure 3:
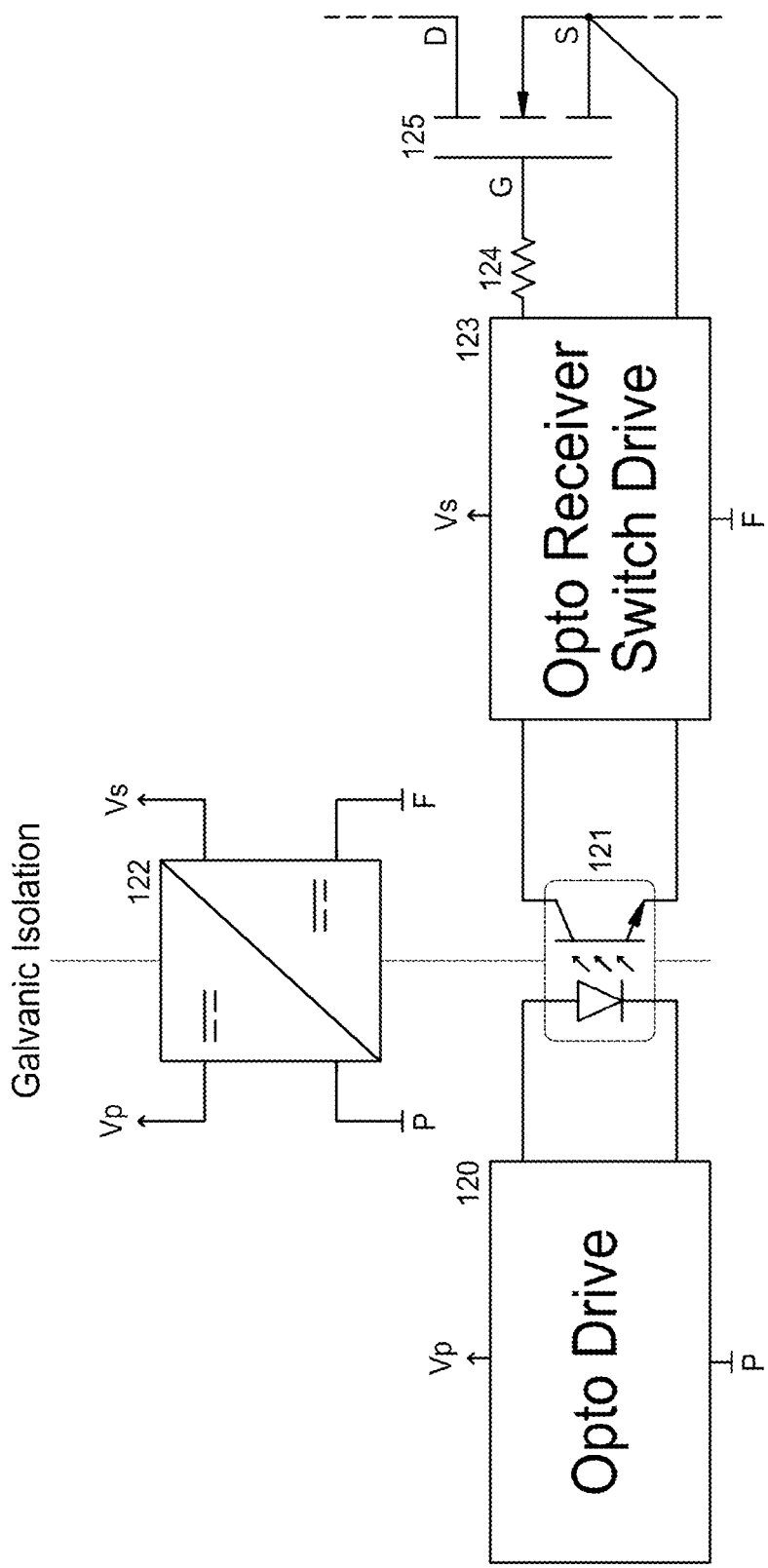
FIG. 3 shows a prior-art optocoupler-based galvanically isolated switch drive circuit.
Figure 4:
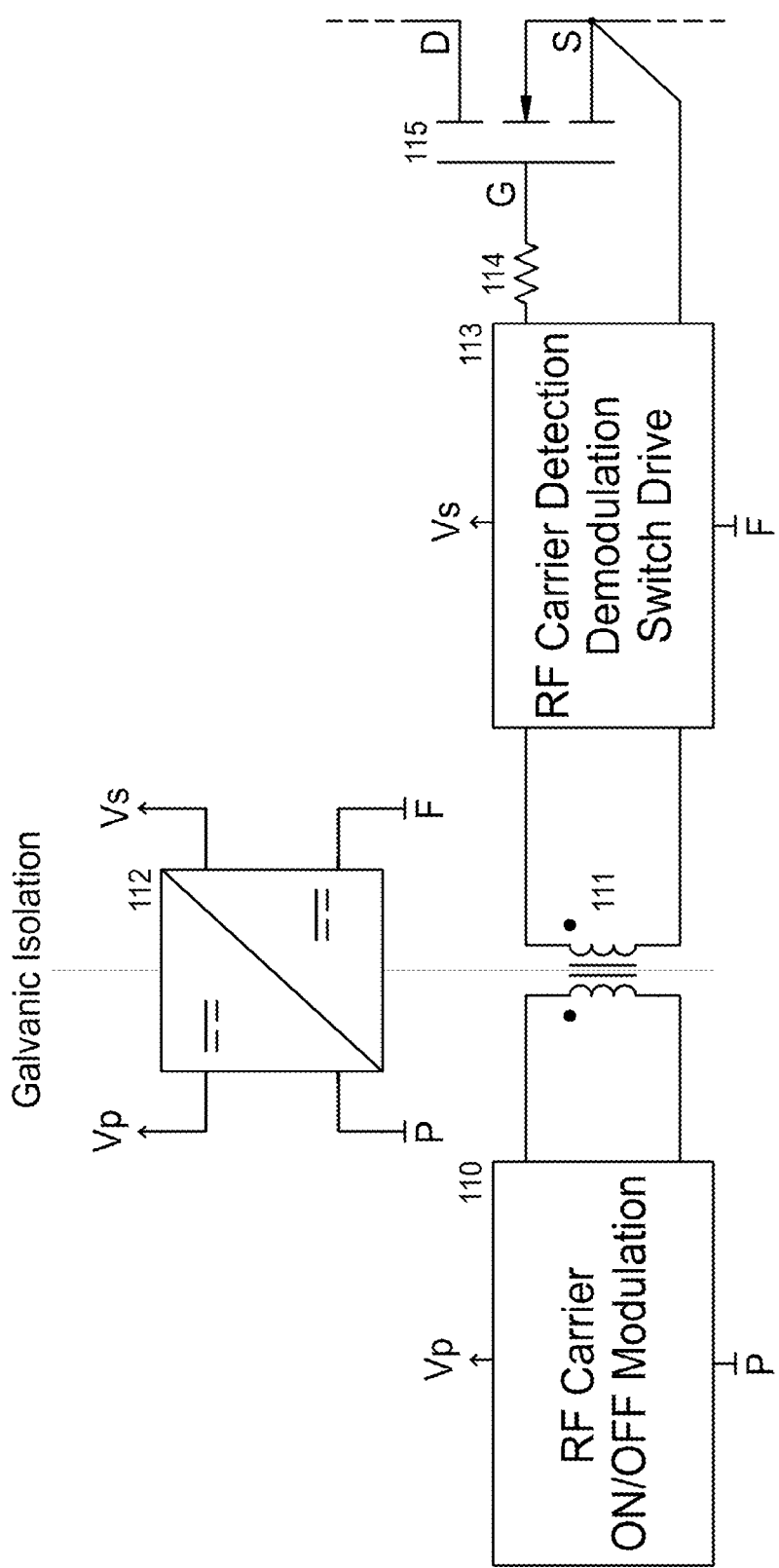
FIG. 4 shows a prior-art transformer-based galvanically isolated switch drive circuit with the transformer operating at a carrier frequency substantially larger than the switching frequency.
Figure 5:
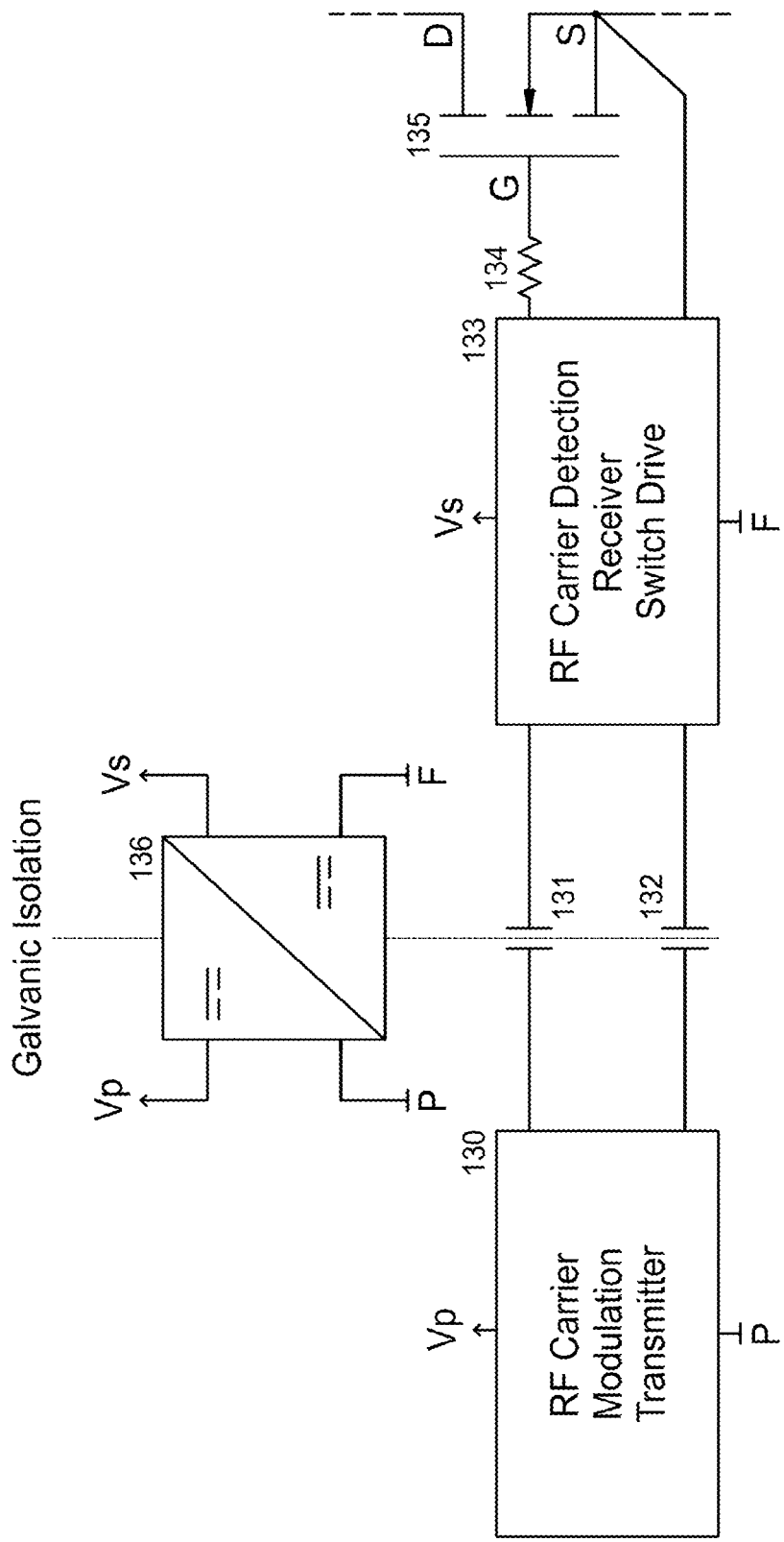
FIG. 5 shows a prior-art capacitively-coupled galvanically isolated switch drive circuit.
Figure 6:
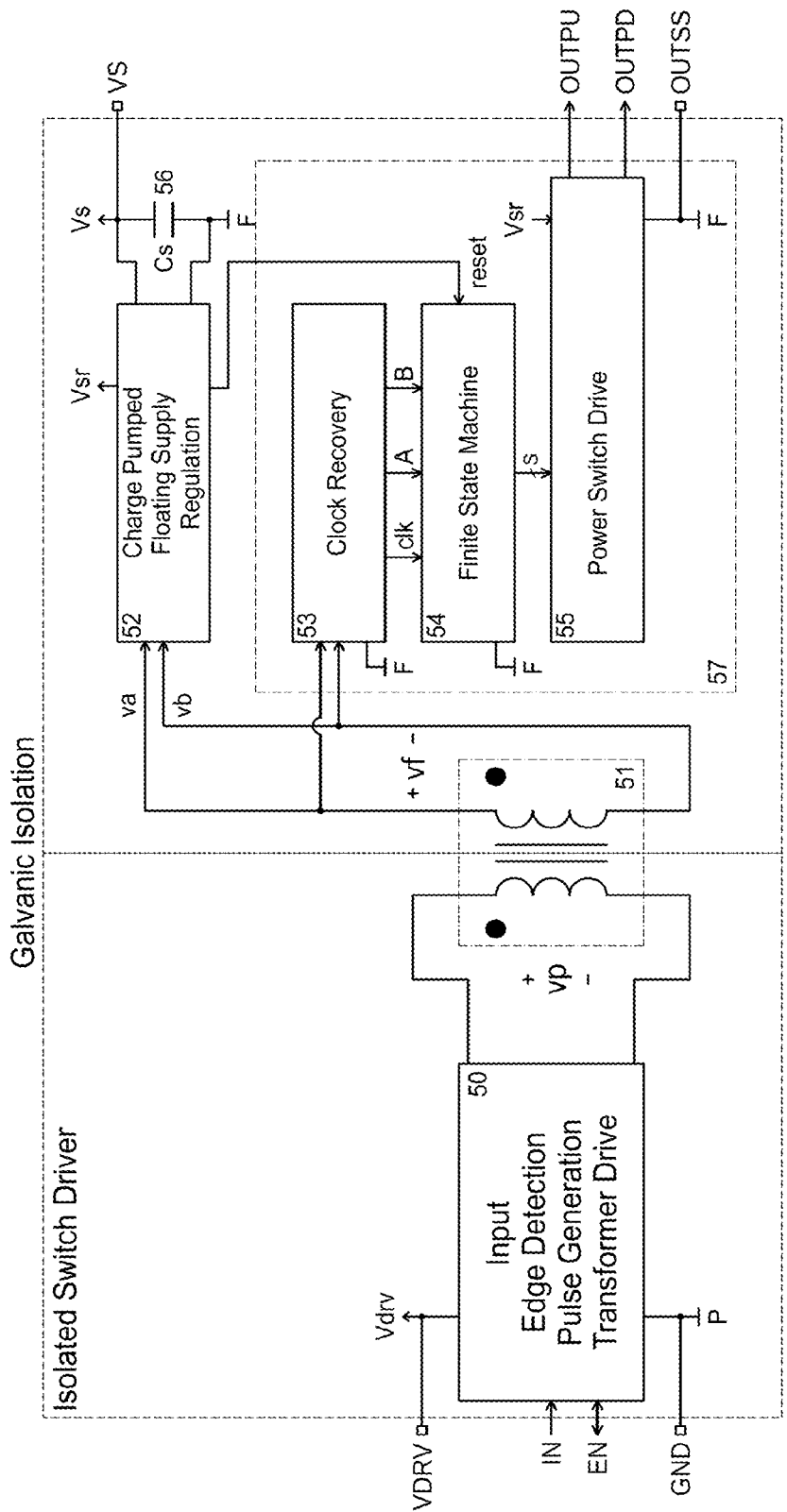
FIG. 6 shows a block diagram of the galvanically isolated low-latency switch drive circuit with power transfer.

FIG. 6 shows an example block diagram of an exemplary arrangement of the present application. It illustrates an implementation of a switch drive circuit to control the operation of a switch. The switch drive circuit provides for both control and power transfer. The gate driver crosses a galvanic isolation barrier through a single pulse transformer 51.

Control and power transfer is performed by transmitting pulses from a first (primary side) winding to a second (secondary side) winding of the pulse transformer.

On the primary side circuit of the switch drive circuit, an incoming signal IN from an external controller enters the primary drive circuit 51. The primary drive circuit is supplied by a primary side supply voltage called Vdrv. Other supply voltages required by the primary side circuit may be derived from Vdrv through the use of optional linear regulators.

The primary drive circuit receives input signal IN and derives switch drive instructions from it. For instance, the input may be interpreted to have two states, high and low. If the state of input IN is considered "high" it is assumed that the external switch driven by the floating side of the driver needs to be turned on. In contrast, if the state of input IN is considered "low" it is assumed that the external switch needs to be turned off. In alternative implementations, input IN may have more states (such as a "float" state, neither high nor low), upon which the driver may enter alternative modes of operation. Detected in changes of input signal IN will be referred to as "switch events" in the remainder of this document.

Optionally the primary drive circuit may also provide a unidirectional or bidirectional enable pin EN. When de-asserted, signal EN instructs the driver to enter a disabled mode. Typically, disabled modes are used in order to reduce the supply current of the switch driver. When asserted, signal EN enables driver and instructs it to enter normal operating mode. Upon entering a primary side fault condition, such as operating voltage Vdrv dropping below a sufficient level, also known as Under-Voltage-Lockout (UVLO), or operating temperature is outside the intended range, also known as Over-Temperature-Protection (OTP), or similar, the driver itself may de-assert EN. When implemented in a bidirectional fashion, signal EN may be de-asserted by either the external controller, or the isolated switch driver, allowing both devices to respond to fault conditions in a desirable synchronized fashion. A bidirectional signal EN may be implemented using a wired-AND connection structure which would be familiar to those skilled in the art.

At the switch turn-on instruction, when input IN is taken from low to high, pulsed information is sent from the primary circuit 50 through the transformer 51 to the floating side of the driver. Similarly, at the switch turn-off instruction when input IN is taken from high to low, pulsed information is sent.

Pulses received at the floating side (on the secondary side of the transformer) are provided to a power supply circuit, which in turn converts them to a secondary side voltage supply Vs. The pulses are also provided to a control circuit 57, which provides switching signals to operate the switch being controlled. Separating the delivery of pulses between the power supply circuit from the control circuit is beneficial as it allows for the control circuit to respond to the arrival of a pulse before the power supply circuit attempts to extract power from the pulse. More particularly, it will be appreciated that delivery of power from a transformer winding is strongly affected by leakage inductance as this limits the rate of voltage change where current (power) is delivered. By allowing the control circuit to detect the arrival of a pulse from the secondary winding before the power supply attempts to draw substantive current from the secondary winding, the effects of leakage inductance are reduced. The reference to substantive current is employed as a small current may be drawn during the delay period before the power supply starts to draw power. The delay may be implemented using a delay circuit. The delay circuit may impose a pre-determined delay or it may limit the power supply drawing current until the voltage (pulse amplitude) presented from the secondary side winding exceeds a pre-determined voltage. In this case, the control circuit is suitably configured to detect the arrival of a pulse based on a voltage below the pre-determined voltage. The delay circuit may comprise a switch for switchably connecting the secondary winding to the power supply circuit after the delay. As discussed below, the switch may inherently provide the delay.

In the exemplary arrangement, the floating supply circuit 52 provides a unipolar supply voltage with reference to a floating reference voltage (ground F). This supply voltage is presented as charge in floating supply capacitor 56. As pulses arrive, the charge in supply capacitor is replenished.

Although the control and power supply circuits on the secondary side may operate using bipolar voltages, it will be appreciated that it is easier to implement unipolar circuits in silicon processes (e.g., CMOS ICs). A pulse rectification scheme is employed to allow for this. The pulse rectification scheme converts bipolar pulses (negative and positive pulses) to first and second control signals having a common polarity wherein one of the first and second control signals is representative of negative pulses and the other is representative of positive pulses. Thus, as shown in the timing diagram of FIG. 10, the bipolar nature of signal Vf on the secondary winding of the transformer is converted into control signals Va and Vb which Va representing positive pulses and Vb representing negative pulses. The use of the pulse rectification scheme means that the voltages present in the control and power supply circuits are unipolar with respect to the floating ground Vf.

The pulse rectification scheme based on active switches within power supply circuit 52 ensures that pulsed power is transferred from the primary side to the floating side in an efficient manner. The rectification scheme may be shared with the control circuit 57. As a result of pulsed power transfer, a floating operating voltage Vs is established with respect to the floating ground. Floating side circuitry of the switch driver can use this operating voltage Vs directly for supply purposes. Optionally, the floating supply circuit 52 may also include means to derive a regulated floating supply voltage Vsr. Supply capacitor 56 may be an on-chip capacitor integrated into the floating drive circuit. As capacitance constraints apply for chip-integrated capacitors, capacitor 56 may alternatively be implemented or amended by a discrete off-chip capacitor connected in parallel.

The isolating pulse transformer 51 is generally utilized to transmit short-duration pulses only. In this context, the term short duration pulses may be taken to be relative to the duration of switching periods of the switch being controlled. This may be seen in FIG. 10, where the duration of the pulses transmitted from the primary side Vp are short relative to the duration of the ON pulse in signal IN. As a result, the time-integral of impressed voltage across its coils, namely vp and vf, remains small. This translates into a small magnetic flux swing in the transformer core, which in turn means that the cross-sectional transformer core area may be made small. As a result, transformer 51 can be manufactured in a compact form lending itself well to package-integration. In the simplest switch driver implementation according to this application, one polarized pulse per switch event will be sent across the pulse transformer 51.

As a result, transformer 51 operates at the switching frequency keeping transformer losses small. Note that this is in contrast to the high pulse repetition frequencies employed in solutions such as Ref. 1.

In normal operation the polarity of applied coil voltage changes in an alternating fashion from pulse to pulse, yielding an average magnetic flux of around 0 volt·seconds (Vs). A bipolar magnetic flux swing around 0 Vs further reduces magnetic core losses allowing for magnetic core size reduction.

In addition, as will be discussed in more detail below, requirements regarding the transformer's leakage inductance may be relaxed, leading to a very simple transformer structure where primary and floating coils can be spatially well separated. Thus, even stringent isolation barrier requirements regarding isolation test and working voltages can be satisfied by transformer 51.

Pulse-rectified voltages va and vb generated by 52 with respect to floating side ground are fed into a clock recovery circuit 53 which extracts a clock signal from the pulses. The clock recovery circuit translates analog voltages va and vb into digital signals A and B and also generates a clock signal clk. In the simplest implementation of the switch driver, signals A and B are single-bit signals. In more elaborate pulse coding schemes (using, e.g., pulse amplitude modulation) signals A and B may be bit-vectors carrying two or more bits each. As pulses are transmitted from the primary side circuit to the floating side circuit following asynchronous switch events, the clock signal clk is generally anisochronous. In other words, while clock signal clk may periodically arrive at the floating side, they are not generally separated by even time intervals. The approach of using an extracted clock signal means that operation is based on pulse transitions rather than pulse amplitudes per se. As a result of this approach it is possible to include additional features and more advanced modulation schemes. This is illustrated in the approach in FIGS. 11 and 16 discussed below.

By carefully sequencing and prioritizing the floating side activities of signal detection and clock recovery first, followed by charge transfer of pulsed power into capacitor 56 second, it can be ensured that the driver's propagation delay measured from the switch event detected at signal IN to the intended response at the driver outputs OUTPU and OUTPD remains unaffected by the transfer of power from the primary to the floating side. This is a key aspect of the present application. It ensures that the driver's propagation delay remains essentially independent of the practical limitations of the pulse transformer 51 including its leakage inductance.

The clock-synchronous finite state machine (FSM) 54 neither assumes nor needs isochronous clock signals. The FSM 54 utilizes digital inputs A and B in conjunction with clock signal clk for cleanly defined clock-synchronous state transitions. An optional reset signal generated on the floating side of the switch driver can be used to asynchronously force the FSM 54 into a known safe reset state, regardless of its current state. The FSM 54 can be implemented in a traditional fashion using Mealy- or Moore-type implementations. The FSM 54 supports interpretation of both simple ON and OFF pulse transmission methods, as well as more complex pulse patterns involving modulation of either or both amplitude as well as time-duration of pulses.

Output S of the FSM 54 controls the output switch drive circuit 55 which in turn generates the pull-up switch drive signal OUTPU as well as pull-down switch drive signal OUTPD. In straightforward implementations output S may be a single-bit digital signal. In other implementations it may be advantageous for the FSM 54 to generate bit-vectors S in order to cater for more advanced control of the FSM 54 over the power switch drive circuit 55.

Splitting the outputs of output switch drive circuit 55 into two independent paths for pull-up and pull-down allows for independent control of gate drive turn-on and turn-off output impedance. For less demanding applications, a single push-pull output may suffice (by simply tying outputs OUTPU and OUTPD together).

It should be noted that in contrast to prior art Ref. 4-7 the floating side of the isolated driver remains in full control of the switch drive at all times, and may autonomously inhibit turning on the power switch when operating conditions are deemed inadequate (e.g., due to floating-side UVLO or other fault conditions) even if a switch turn-on instruction was detected at input IN. In other words, the floating side circuit of the isolated switch driver may override switch instructions received at input IN when necessary.

At system start-up, the floating side supply voltage(s) can be safely established by the primary side sending a sufficient number of OFF pulses, prior to entering normal operation. This allows the floating side supply circuit 52 to ramp up and establish an operating voltage Vs while at the same time ensuring that the power switch is not unintentionally and prematurely turned on.

The present application also supports operation of the power switch at very low switching frequencies all the way down to DC (i.e., static) operation. During static operation, without any pulses arriving at the floating side, the continuous supply current on the floating side would lead to a slow discharge of supply capacitor 56. By detecting the absence of state changes at input IN, the primary side can autonomously intervene and periodically transmit either ON or OFF pulses (in according with the static state of IN) in order to maintain an orderly floating side operating voltage as well as continuously hold the power switch in the desired state. This refresh operation is managed by a refresh circuit residing within primary side control circuit 50.

Figure 7:
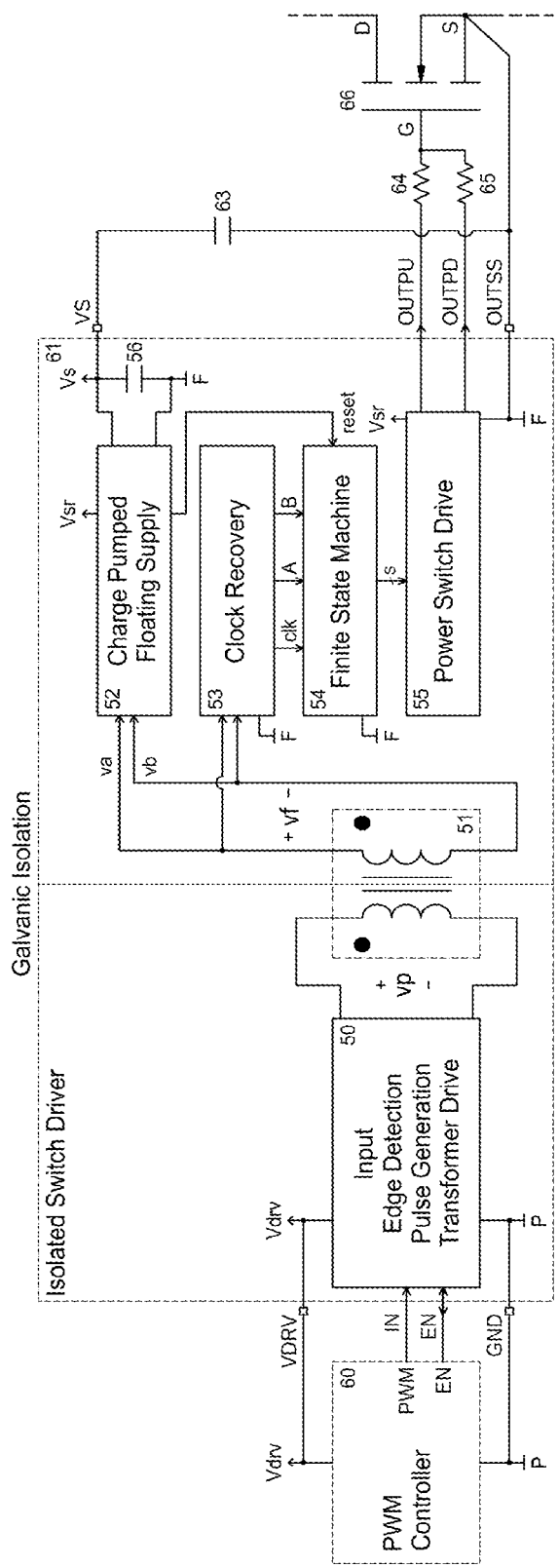
FIG. 7 shows the galvanically isolated switch drive circuit in a typical application with drive instructions coming from a PWM controller, and the switch drive circuit driving a switch across an isolation barrier.

FIG. 7 shows the galvanically isolated switch driver 61 discussed above in a typical simplified system arrangement. A PWM controller 60 provides the isolated switch driver 61 with inputs IN and bidirectional signal EN. On the floating side, integrated floating supply capacitor 62 may be connected in parallel with a discrete capacitor 63 in order to achieve an increased value of floating side supply capacitance.

The outputs of isolated switch driver 61, namely OUTPU and OUTPD, are connected through resistors 64 and 65 to the gate G of the power switch 66. By varying resistance values of resistors 64 and 65 respectively, the effective turn-on impedance and turn-off impedance can be independently adjusted by the system designer. The driver's floating reference point is connected via pin OUTSS to the reference electrode S of power switch 66.

Figure 8:
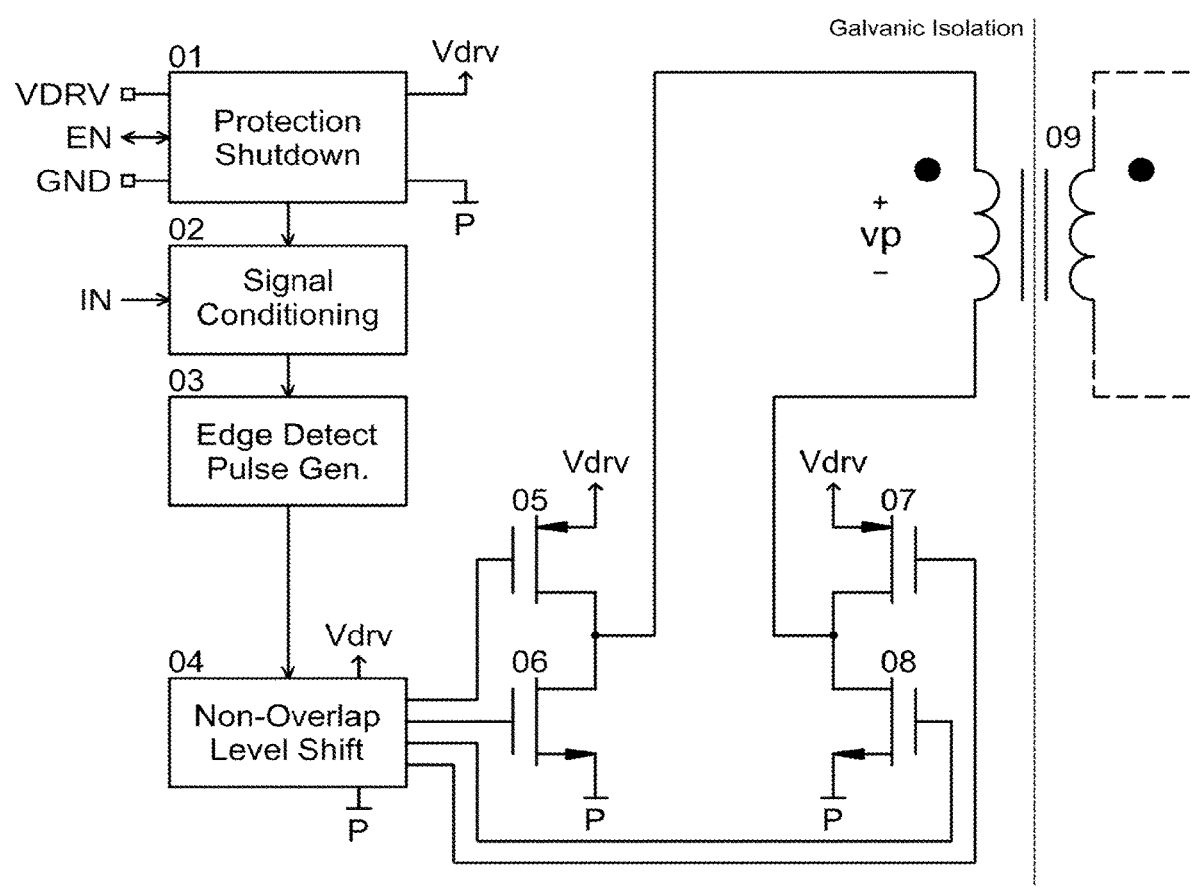
FIG. 8 shows a typical primary side block diagram for the galvanically isolated switch drive circuit.

FIG. 8 shows an example primary side block diagram for the galvanically isolated switch drive circuit. Primary side supply circuit 01 receives primary side supply voltage through pins VDRV and GND and distributes voltage Vdrv as well as primary ground to the various primary side circuit blocks. Circuit 01 may optionally generate additional regulated or unregulated supply voltages as required by other primary side circuit blocks. Circuit 01 may also include additional optional functionality such as primary side under-voltage lock-out (UVLO), over-temperature protection (OTP) or similar. Energy-saving shutdown modes may also be supported by circuit 01 through the use of the previously discussed bidirectional signal EN.

Circuit block 02 conditions the input signal received at pin IN, comparing it to two or more defined state voltage thresholds. If input IN is found to be logic high, it is assumed the power switch needs to be turned on. If input IN is found to be logic low, it is assumed the power switch needs to be turned off. Optionally additional states of signal IN may be detected. For instance, it may be advantageous to detect a floating input state. For example, upon detection of a floating IN the isolated switch driver may enter a power-saving mode.

Figure 10:
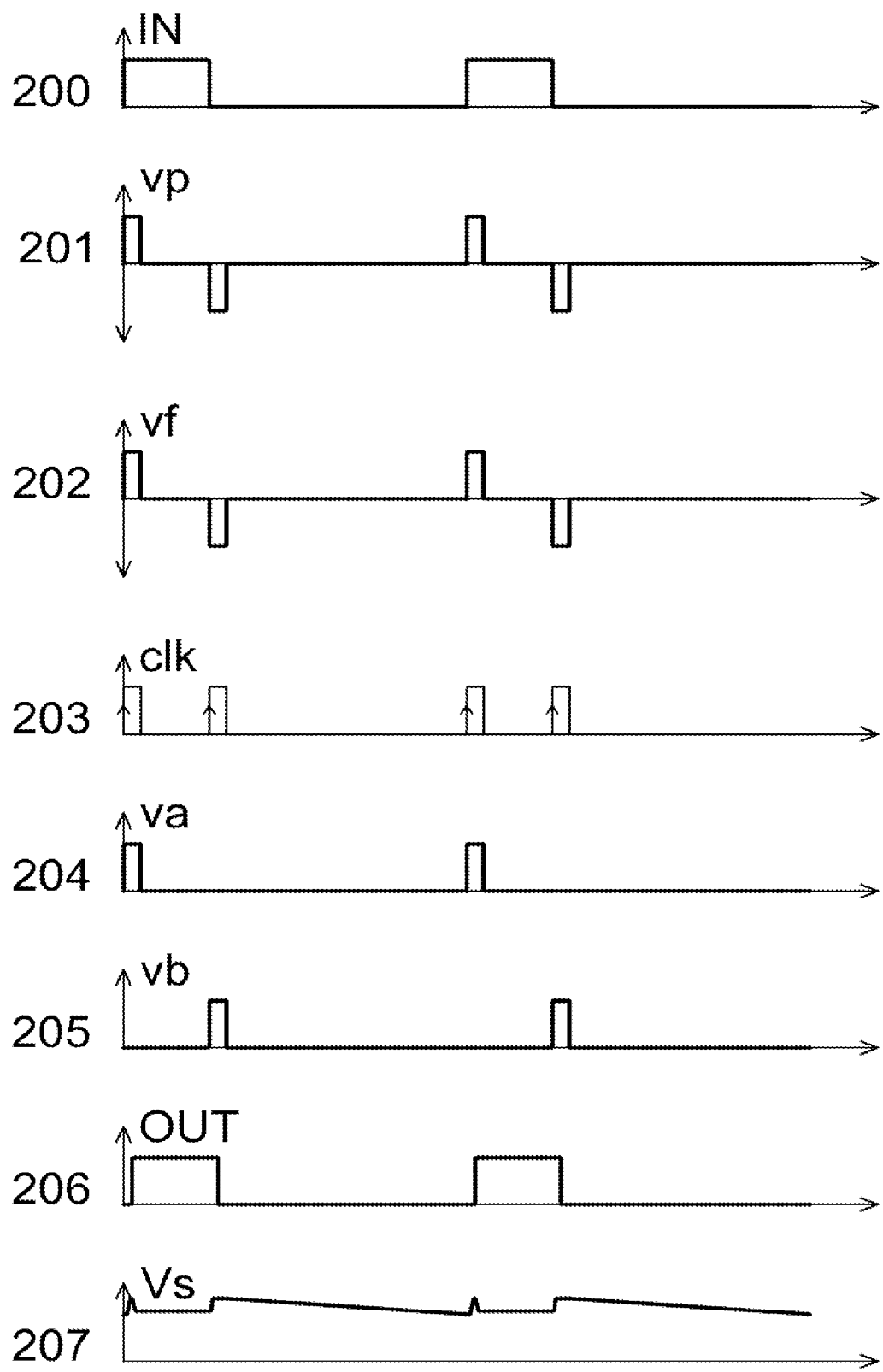
FIG. 10 illustrates the behavior and timing relationships of key signals of the galvanically isolated switch drive circuit. A straightforward pulse generation scheme is employed here.

Primary circuit block 03 detects changes in logic state of input IN. In response to changes in the logic state either short single pulses or alternatively more advanced pulse sequence patterns are generated by block 03. In the simplest implementation a pulse of a defined duration and defined voltage polarity across the primary coil of pulse transformer 09 is generated at the low-to-high transition of input IN, while a pulse of the same duration but opposite voltage polarity is generated at the high-to-low transition of input IN. This is illustrated in FIG. 10 (signals 200 and 201). The rising edge of input IN produces a short voltage pulse vp 201 of positive polarity, while the negative edge produces a short voltage pulse vp of negative polarity.

The duration of the pulses is just sufficiently long for the floating side of the isolated switch driver to reliably detect their presence, and also to support adequate amounts of pulsed power transferred to the floating side supply circuit. In typical applications the duration of the pulses can be a small fraction of the overall switching time period. During normal operation subsequent pulses sent across the isolation transformer 09 are of alternating polarity, ensuring that the average magnetic core flux remains close to zero.

Pulses generated by block 03 are conditioned by circuit block 04 in order to ensure that the conventionally arranged H-bridge switches 05-08 are operated efficiently without cross-conduction and with suitable gate drive levels. The H-bridge may be implemented using standard nMOS or pMOS devices as shown in FIG. 8.

Figure 11:
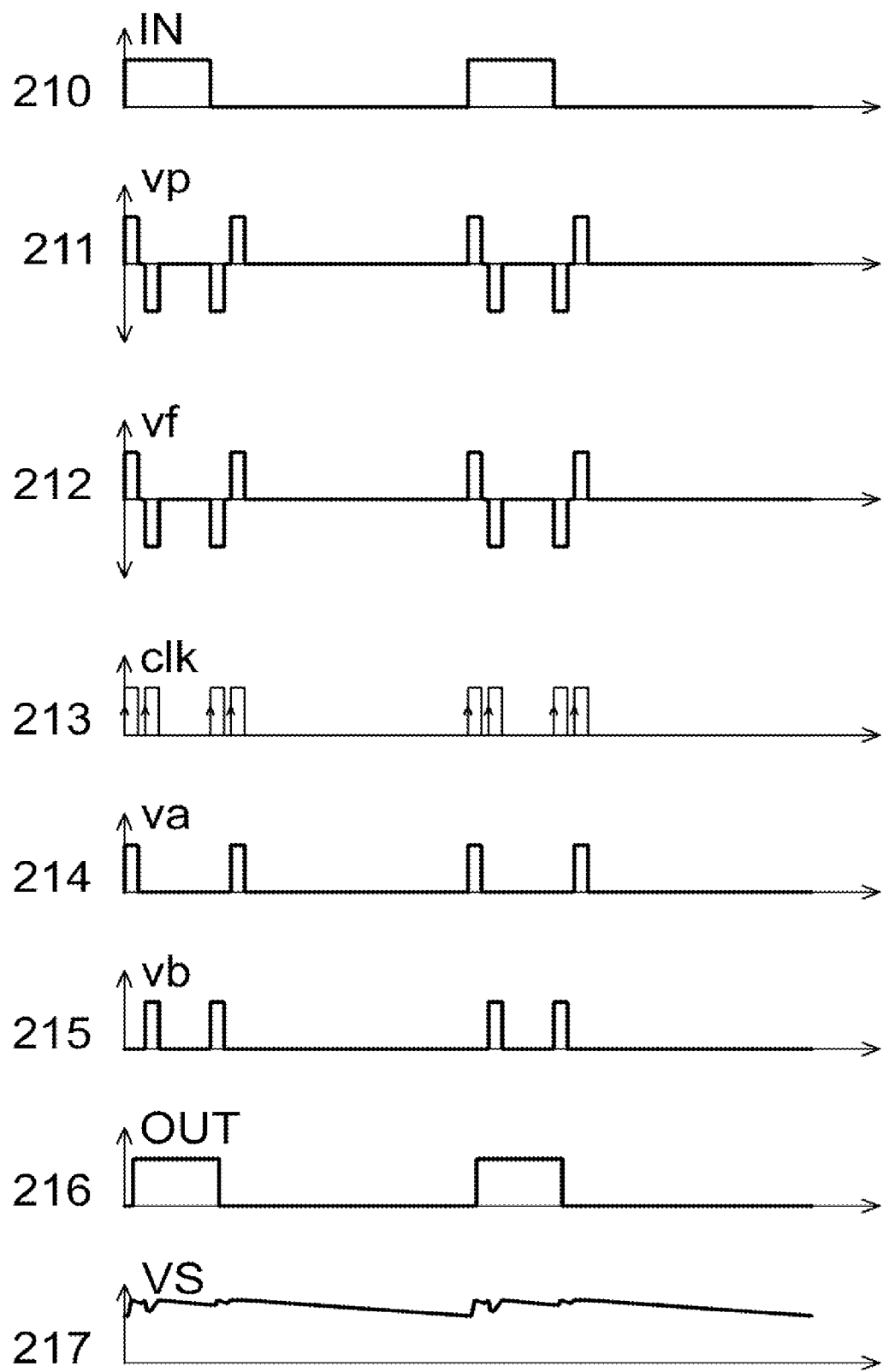
FIG. 11 illustrates an alternative behavior and timing relationships of key signals of the galvanically isolated switch drive circuit. A more advanced pulse generation scheme is employed here.

In a more advanced implementation of the isolated switch driver more complex pulse patterns may be generated by circuit 03 and transmitted through pulse transformer 09. An example alternative pulse pattern is illustrated in FIG. 11. Here, low-to-high transitions of input IN generate pulse pairs of opposite polarity voltage pulses, with a positive pulse immediately followed by a negative pulse to form a pair as shown in FIG. 11 (signal 211). Similarly, high-to-low transitions of input IN generate a pulse pair with a negative voltage pulse immediately followed by a positive voltage pulse. Generating multiple pulses per IN state transition has the advantage that multiple power pulses per switching cycle are transmitted to the floating side relaxing the requirements for the floating side supply including its energy storage capacitance. The drawbacks of transmitting multiple pulses per IN state transition include: 1) increased core losses in the pulse transformer due to an effective increase in pulse repetition frequency and 2) more advanced pulse pattern decoding in the secondary side leading to potentially higher propagation delays. However, by increasing the pulse repetition frequency, the duration of the pulses may be reduced even further compared to a single pulse per IN state transition.

Figure 9:
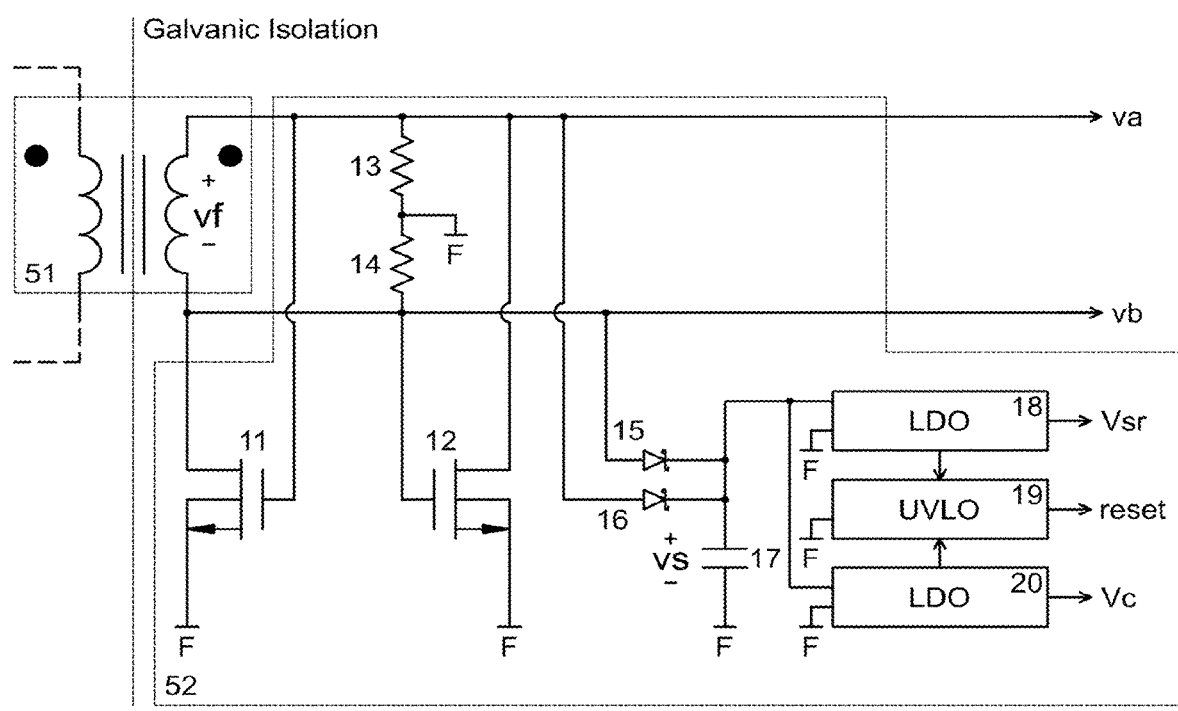
FIG. 9 shows a high-efficiency pulse rectification circuit and voltage supply circuit used on the floating side of the galvanically isolated switch drive circuit.

FIG. 9 shows an exemplary pulse rectification scheme comprising a high-efficiency pulse rectification circuit and voltage supply circuit used on the floating side of the galvanically isolated switch drive circuit. The high-efficiency active pulse rectification circuit consists of active nMOS switches 11 and 12, as well as optional potential-tie resistors 13 and 14.

The floating side bipolar coil voltage vf is illustrated in FIG. 10 (signal 202). Voltage vf is essentially a floating side replica of primary coil voltage vp (signal 201) scaled by the turns-ratio of the pulse transformer 10.

As soon as a voltage pulse vf of positive polarity and sufficient magnitude is seen, switch 11 of FIG. 9 turns on and temporarily establishes a connection between the lower terminal of the transformer 10 and floating side ground. This generates a positive voltage pulse va with respect to floating side ground as illustrated in FIG. 10 (signal 204) for the duration of the incoming positive voltage pulse vf. In contrast, a voltage pulse vf of negative polarity and sufficient magnitude will turn on switch 12 temporarily establishing a connection between the dotted terminal of the pulse transformer 10 and floating side ground. This generates a positive voltage pulse vb with respect to floating side ground as illustrated in FIG. 10 (signal 205).

In essence, the high-efficiency pulse rectification circuit formed by switches 11 and 12 prevent any other component terminal of the floating side circuit to be exposed to substantially negative voltages (with respect to floating side ground) which greatly simplifies integration of the components into an integrated circuit (IC). This fact is also illustrated in FIGS. 10 and 11 with pulse transformer voltages vp and vf (signals 201, 202, 211, 212) representing the only bipolar voltages in the circuit. All floating side signals and circuit nodes remain essentially unipolar with respect to the floating side ground.

In contrast to diode-based pulse rectification schemes the active pulse rectification scheme just described allows power to be transferred from the primary side to the floating side at a much higher power transmission efficiency incurring much lower conduction losses. Although, diodes could be employed if such losses were acceptable.

Tie resistors 13 and 14 ensure that circuit nodes va and vb remain defined with respect to floating side ground during periods of absence of pulses. Resistors 13 and 14 weakly pull circuit nodes va and vb to floating side ground whenever voltage of is near zero. Impedance values of resistors 13 and 14 can be chosen to be high, kilo-Ohms (kΩ) or higher, ensuring that the efficiency of power transfer remains largely unaffected.

The outputs of the pulse rectification circuit, namely va and vb, can be used to transfer power into floating side supply capacitor 17. A simple diode-based charge scheme can be used as shown in FIG. 9 (using diodes 15 and 16). The charge of supply capacitor 17 is replenished each time the voltage at either node va or vb exceeds the instantaneous floating side supply voltage Vs by one diode forward voltage drop. Resistors in series with diodes 15 and 16 may be used to limit the pulsating charge currents into capacitor 17 but are typically not required. The top-up charge into supply capacitor 17 at each power pulse ultimately originates on the primary side of the isolated switch circuit. Re-charge currents into floating supply capacitor 17 flow through the respective diagonal pair of primary H-bridge switches, pulse transformer coils, floating side pulse rectification switch (either 11, or 12) and a peak rectification diode (either 15, or 16). The components in the re-charge path are low-impedance ensuring that capacitor 17 is re-charged rapidly at each pulse transferred. The slew-rate of the re-charge current pulses into capacitor 17 is limited by the pulse transformer's leakage inductance.

It is important to note that the pulse rectification circuit ensures that voltages va and vb are allowed to rise quickly to substantial and detectable levels prior to either diode 15 or 16 becoming forward biased. Thus, the diodes 15 and 16 may be used to effect the above referenced delay between detection by the control circuit of a pulse and the drawing of power by the power supply circuit from the winding. Thus, switch turn-on and switch turn-off information carried by the onset of voltage pulses can be detected rapidly by the clock recovery circuit (discussed below), prior to substantial replenishment current pulses into capacitor 17 begin to flow. It is further important to note that the leakage inductance of pulse transformer 10 does not slow down the initial rising edges of va and vb. Hence the signal transmission from primary drive circuit to floating side circuit is essentially independent of leakage inductance.

The re-charge currents into supply capacitor 17 replenishes its charge and tops up voltage Vs across capacitor 17. This is illustrated in FIG. 10 (signal 207) and FIG. 11 (signal 217). Shortly after the rising edge of either voltage va or vb, voltage Vs is topped up. During normal operation voltage Vs remains above a certain lower limit in order to keep the floating side circuitry powered at all times.

It may be desirable to create additional regulated floating side supply voltages. This can be simply achieved using optional linear regulators 18 and 20, providing regulated supply voltage Vsr, as well as regulated digital supply voltage Vc. If any of the floating side supply voltages drops below acceptable levels, or if any other floating side circuit problems are detected (e.g., over-temperature) a reset signal is generated by floating side protection circuit block 19.

At system start-up, prior to the arrival of any pulses, capacitor 17 is discharged, and no supply voltage is available on the floating side of the driver. Voltage Vs is near zero, and so are derived voltages Vsr and Vc. In order to safely and quickly ramp the floating side supply voltage Vs up to an acceptable level, the primary side circuit can send one or more OFF pulses across the isolation barrier. Each OFF pulse will be pulse-rectified as neither the pulse rectification switches 11 and 12 nor the pulse charge diodes 15 and 16 require any operating voltage. Voltage Vs will quickly reach sufficient operational levels after the transmission of one or more OFF pulses. Transmitting OFF pulses during system start-up ensures that the power switch is never unintentionally or prematurely turned on.

In situations where the switching frequency drops to very low levels, or even reaches a system condition where the power switch needs to be statically turned ON or OFF, supply voltages Vs would decay towards zero in the absence of any pulses arriving at the floating side (as floating side supply currents would slowly discharge capacitor 17). A primary side auto-refresh circuit can detect these low-frequency or DC situations, and autonomously intervene in order to transmit refresh-pulses of ON or OFF polarity across pulse transformer 10, maintaining the power switch state in accordance with the state of input signal IN, as well as topping up floating supply voltage Vs. This auto-refresh mode is entered by the galvanically isolated switch driver transparently to the user.

Figure 12:
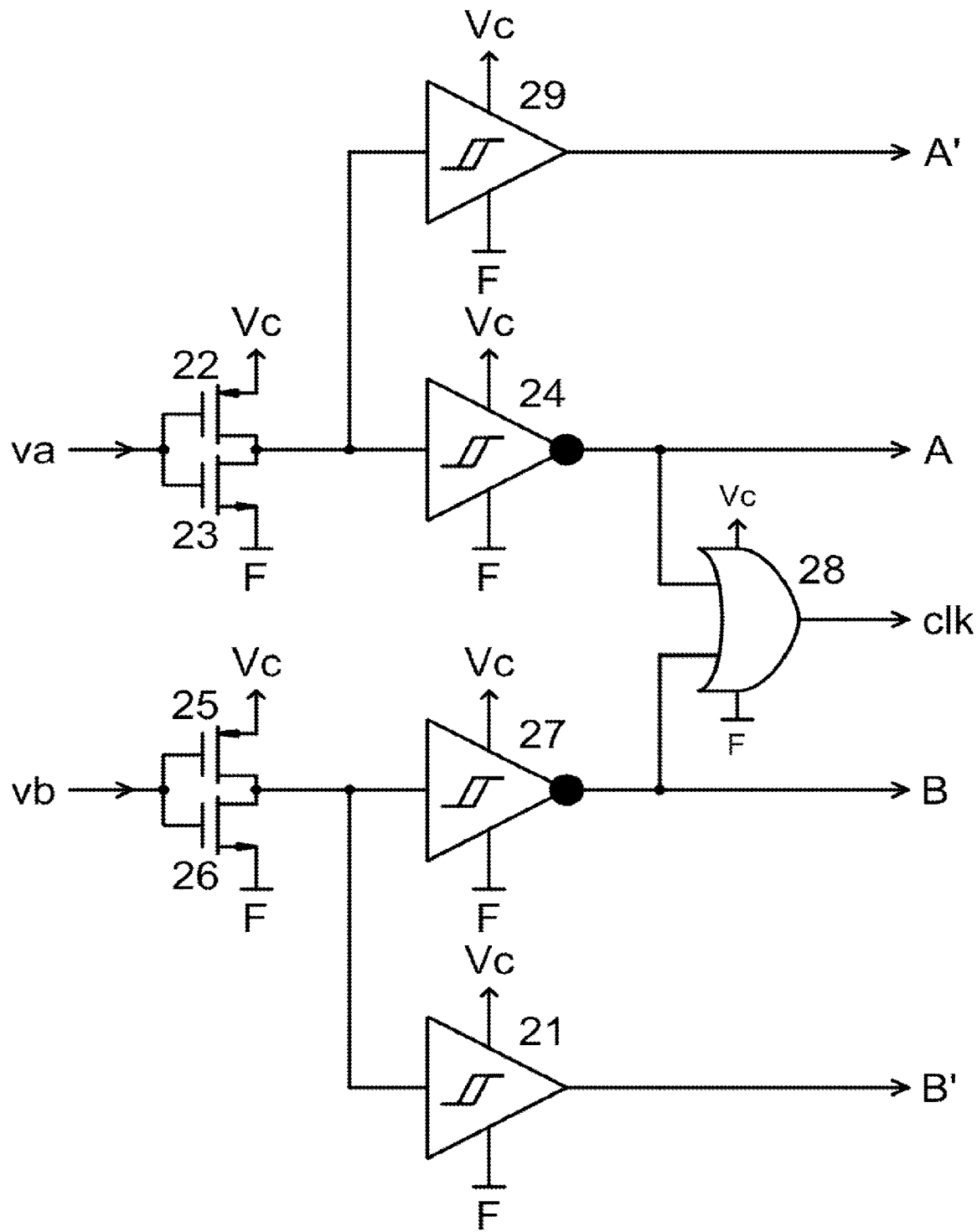
FIG. 12 shows a signal extraction and clock recovery circuit used on the floating side of the galvanically isolated switch drive circuit.

FIG. 12 shows a simple example of a signal extraction and clock recovery circuit used on the floating side of the galvanically isolated switch drive circuit. Incoming voltage pulses of sufficient magnitude at circuit node va are inverted and level-shifted into the logic voltage range using an inverter based on nMOS 23 and pMOS 22. The output of the level-shifting inverter is fed into a Schmitt-trigger inverter 24 yielding additional noise-immunity and sharpened slew rates. The output of inverter 24 provides a re-generated clean logic-level image A with very little propagation delay (a few tens or hundreds of pico seconds typically) relative to the incoming voltage pulses va. Optionally, if required by the FSM, the logic binary complement of A, referred to as A', can also easily be generated using Schmitt-trigger buffer 29. Having matching inverting and non-inverting Schmitt-trigger elements side by side ensures that signals A and A' assume valid states approximately concurrently.

Voltage pulse signal vb is processed in the same fashion using level-shifting inverter formed by nMOS 26 and pMOS 25 following by Schmitt-trigger inverter 27. Optionally, if required, the binary complement of B, namely B', can also be generated as shown using Schmitt-trigger buffer 21.

A clock signal for edge-sensitive circuitry responsive to the positive edge can be easily created by logically OR-ing digital signals A and B as pulses A and B never coincide, i.e., never assert concurrently. This is achieved through OR gate 28 providing clock signal clk useful for clocking the subsequent synchronous FSM discussed below.

It should be noted that even during situations where a vf voltage pulse of a certain polarity is immediately followed by a voltage pulse of the opposite polarity, voltage vf has to cross zero volts at some point implying that one of the pulse rectified signals (va or vb) drops to zero prior to the other one rising.

By deriving the clock signal from logic signals A and B through a logic component such as the OR gate 28, it is ensured that signals A or B assert prior to the active rising clock edge (by one gate propagation delay). This will generally satisfy set-up timing constraints for the synchronous implementation of the FSM.

Typical clock signals generated by the clock recovery circuit are shown in FIG. 10 (signal 203) and in in FIG. 11 (signal 213).

Figure 13:
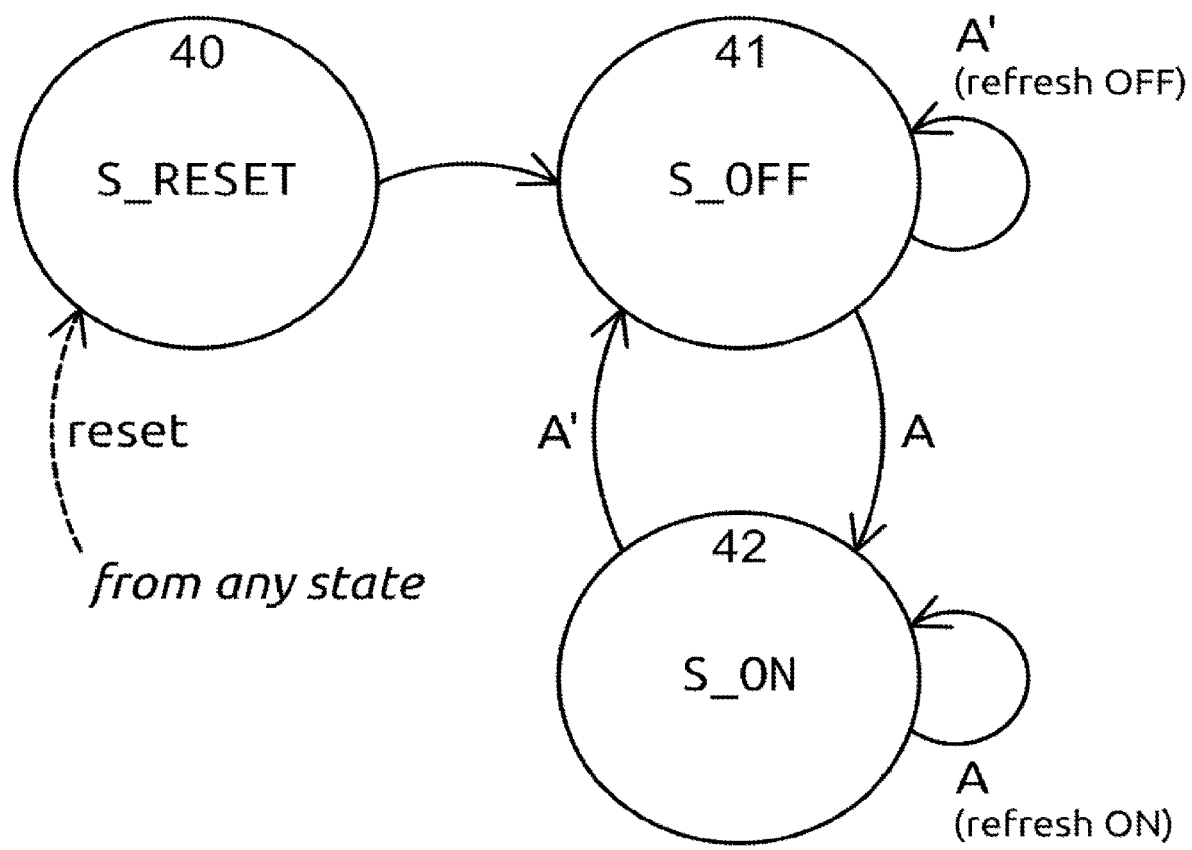
FIG. 13 shows an example state transition diagram illustrating the operation of the clock-synchronous finite state machine (FSM) used on the floating side of the galvanically isolated switch drive circuit.

FIG. 13 shows a state transition diagram illustrating the operation of a simple example implementation of the clock-synchronous finite state machine (FSM). The three FSM states are: S_RESET, S_OFF and S_ON. During normal operation the FSM cleanly changes state synchronously, following defined clock events, namely the rising edge of the clock signal. Synchronous state transitions are illustrated using solid lines with arrows. The condition for the respective state transition is shown in text form next to the arrowed state transition line. Solid state transition lines indicate synchronous state transitions, while dashed state transition lines indicate asynchronous state transitions.

The simple FSM of FIG. 13 only needs one independent steering logic input (A and its binary complement A') in addition to the clock signal. As shown all state transitions are clock-synchronous with the exception of the reset state S_RESET which may be entered asynchronously whenever the reset signal asserts.

While FSM remains in the reset state S_RESET, internal blocks of the floating side circuitry remain initialized, and the output S of the FSM is forced to the safe default state. After release from the reset state, at the first synchronous transition, the FSM unconditionally enters the safe S_OFF state. Normal periodic synchronous operation can then commence.

Normal operation is straightforward: At each active clock event, with A asserted, the FSM either enters or remains in state S_ON. In contrast, at each active clock event, with A' asserted, the FSM either enters or remains in state S_OFF. The FSM supports both normal periodic operation, as well as operation in refresh mode previously described.

The FSM provides a synchronous output S. Output S may either be a single bit output or a bit-vector, depending on the needs of the floating side driver output.

The FSM will recover into the safe reset state following floating side fault conditions. The FSM is more robust than asynchronous designs in that states S_OFF and S_ON can only be entered following active clock edges after being released from reset. In contrast, asynchronous designs (e.g., based on SR latches) could erratically enter active states immediately following release from reset, and are thus undesirable.

Figure 14:
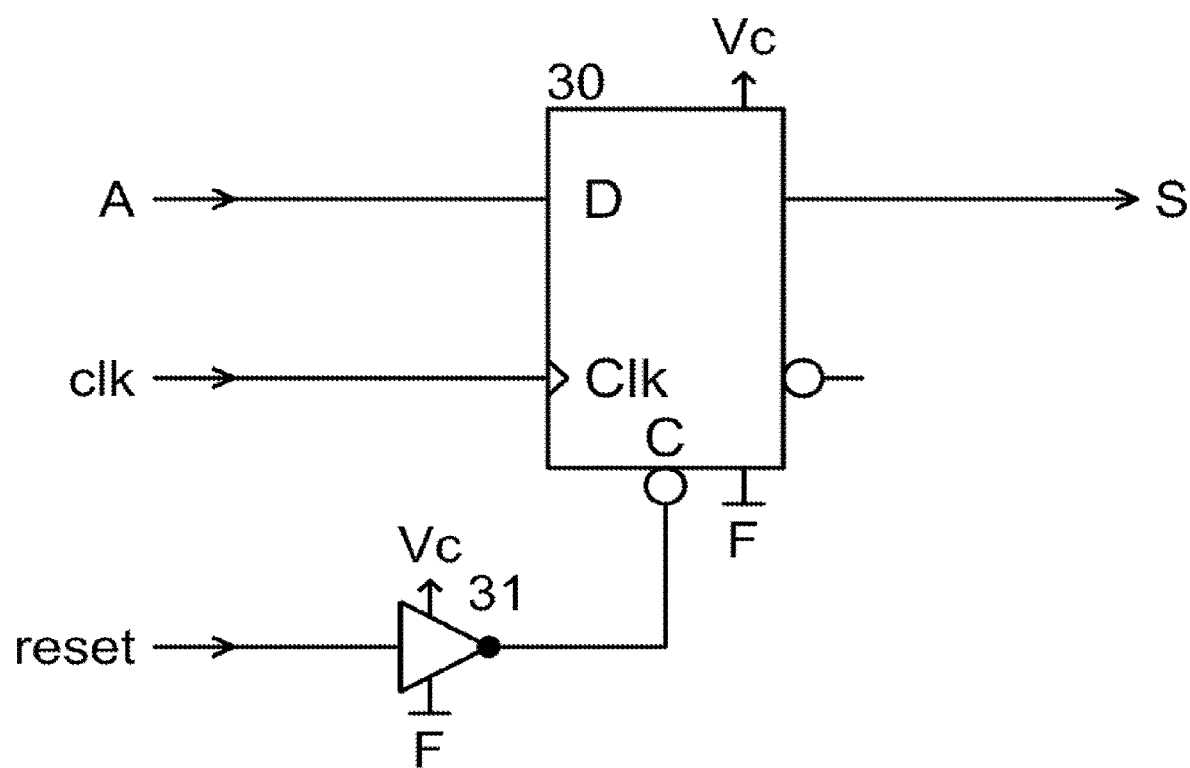
FIG. 14 shows an example circuit implementation of the clock-synchronous finite state machine (FSM)

FIG. 14 shows a minimalist circuit implementation of the clock-synchronous FSM discussed above. As the FSM states S_RESET and S_OFF generate the same output S=0, they have been simplified and combined into a single state. In other words, the FSM has been reduced to two effective states, which can be implemented using a single clock-sensitive data flip-flop (DFF) 30. The non-inverting output of DFF 30 provides output S. The inverting output of DFF 30 is not used. Following standard convention, the DFF 30 also provides an active-low asynchronous clear facility through an input C, which can be easily driven by the logic complement of input reset, provided by inverter 31. The FSM shown in FIG. 14 is extremely robust as it has no capability to hold illegal states.

Figure 15:
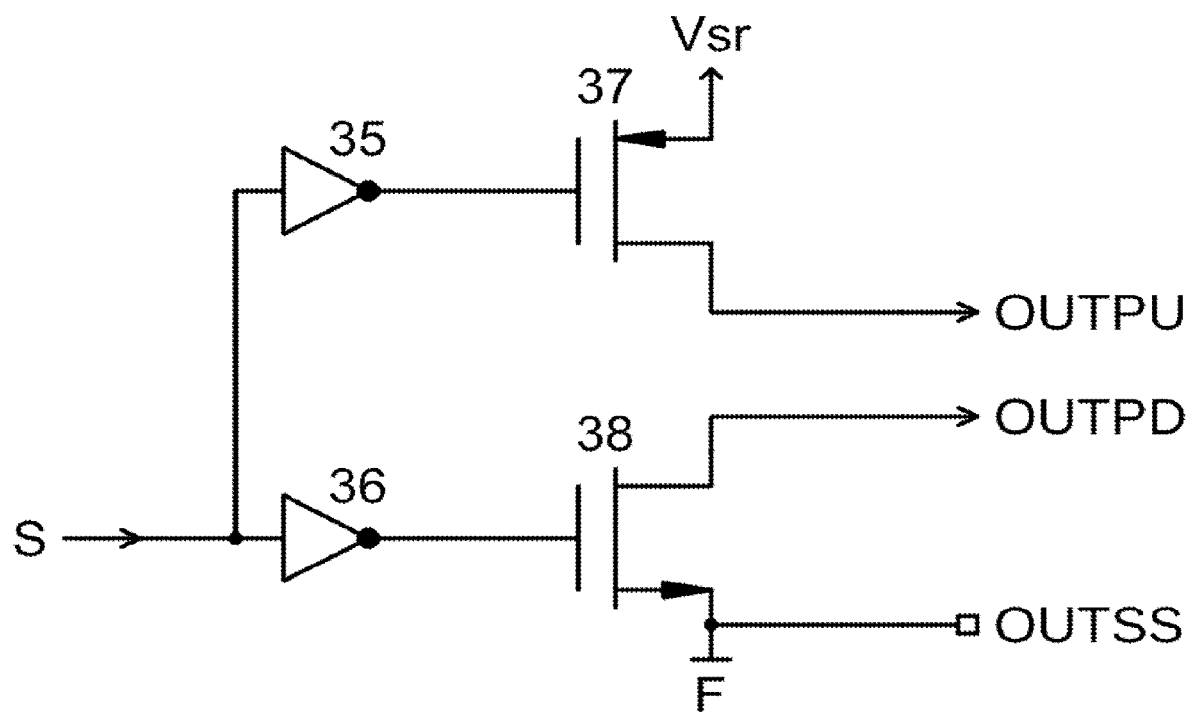
FIG. 15 shows an example circuit implementation of the power switch drive circuit on the floating side of the galvanically isolated switch drive circuit.

The split output drive stage of the floating side of the galvanically isolated switch circuit is shown in FIG. 15. As discussed earlier it is advantageous to equip the output drive stage with independent pull-up output OUTPU, and pull-down output OUTPD as shown. Output OUTPU is pulled towards the positive floating supply voltage Vsr using pMOS transistor 37 if input S=1. Output OUTPD is pulled down to floating ground using nMOS transistor 38 if input S=0. Inverters 35 and 36 convert the incoming signal S from the FSM into suitable gate drive signals for transistors 37 and 38.

Figure 16:
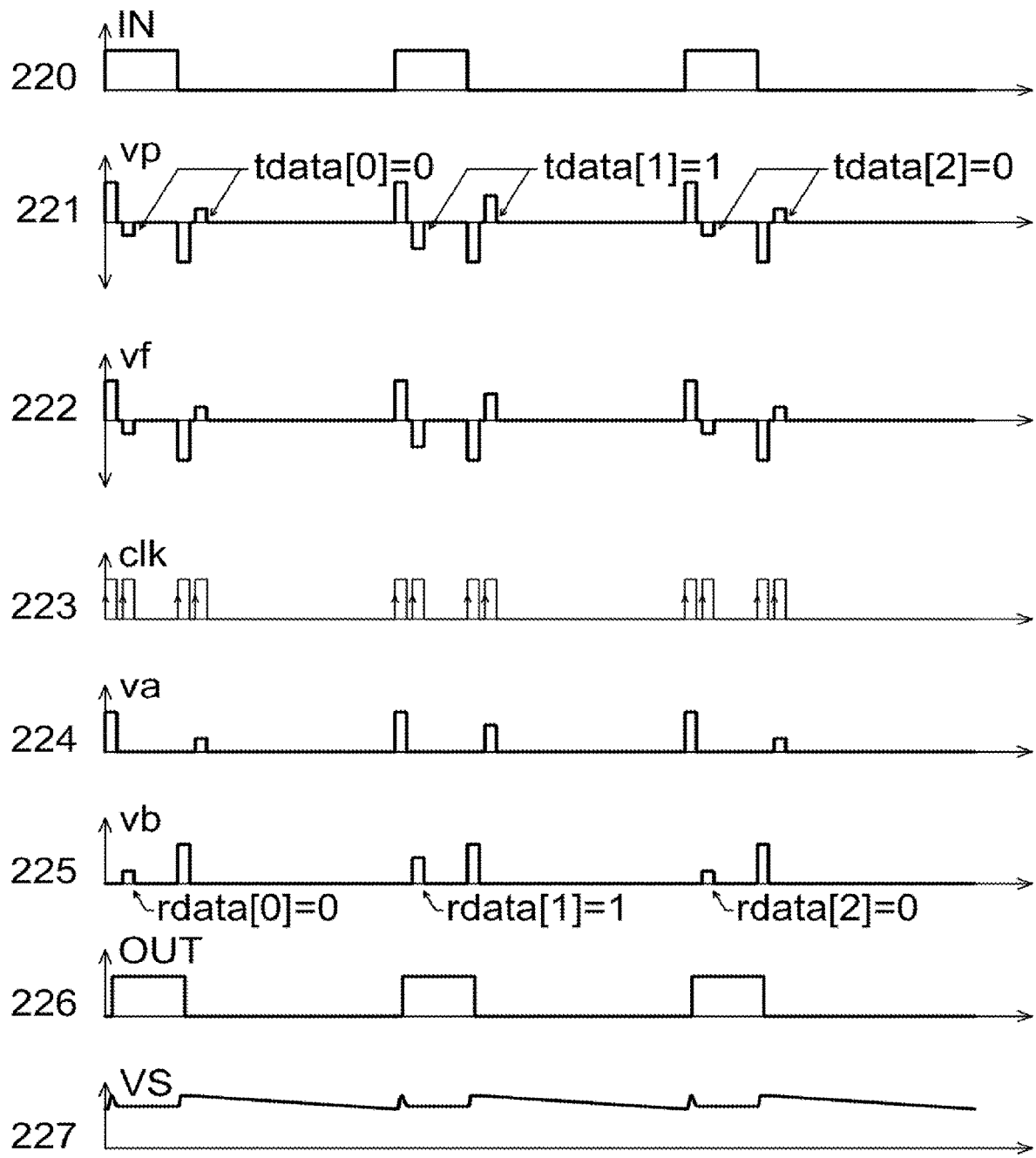
FIG. 16 shows an example of a pulse-amplitude-modulated (PAM) information transmission scheme embedded from primary side to floating side of the isolated switch driver.

FIG. 16 illustrates an example of an exemplary modulation scheme which may be implemented. In this arrangement as before the transition of pulses (rising/falling edges) dictates the timing of switching signals for switching the switch. However, at the same time pulse-amplitude-modulation (PAM) is employed in order to transmit auxiliary information. This auxiliary information is transmitted in addition to switch ON/OFF information and power from the primary side to the floating side of the driver. A demodulator may be employed to demodulate the auxiliary information from the PAM pulses. The auxiliary information may for example be used to adjust the floating side regulated drive voltage Vsr.

The PAM example scheme shown in FIG. 16 is a more advanced version of the double-pulse scheme shown in FIG. 11 which was previously discussed. Instead of using pulse pairs of fixed amplitudes, the PAM scheme uses the second pulse of each pulse pair to transmit one bit of data from the primary (or transmit) side to the floating (or receive) side. In order to maintain a balanced flux in the pulse transformer, subsequent ON and OFF pulse pairs per switching cycle transmit the same data. The information pulses are amplitude modulated. In the given example a pulse of lower magnitude represents a binary '0' while a pulse of higher magnitude represents a binary '1'. One bit of information is thus transmitted per switching cycle from the primary side to the floating side. As two pulses of opposite polarity but same magnitude are transmitted per switching cycle, redundancy occurs which can be utilized for error detection purposes.

The information bits transmitted can easily be fed into a parallel-to-serial converter on the pulse generator on the primary side and converted back into a parallel data word through a serial-to-parallel data converter on the floating side using an enhanced FSM. Thus, bit vectors of any word length can be transmitted by packaging the data. Data packets can be further enhanced to allow for error detection and/or error correction using known communication techniques.

Information bits generated and serialized on the primary side by an enhanced pulse generation block is fed into an amended primary side drive bridge using six instead of four bridge devices to allow for PAM. The transmitted bits are referred to as tdata[x] in FIG. 16 (signal 221). On the floating receiver side, simple amplitude comparators can be used in an enhanced version of the clock recovery circuit in order to demodulate the incoming data. Received data is referred to as rdata[x] in FIG. 16 (signal 225).

The PAM scheme presented in FIG. 16 should be considered an example. Many variations of the scheme are possible. For example, the simpler single-pulse per ON/OFF event scheme shown in FIG. 10 can be modified to include PAM.

In other implementations it may be preferable to use pulse-duration-modulation (PDM) instead of PAM, or in conjunction with PAM, in order to transmit data.

It will be appreciated from the claims that follow that the described arrangements present a series of separate useful approaches which while stated as independent claims may be combined usefully together in any combination.

In the foregoing specification, the application has been described with reference to specific examples of embodiments. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Because the apparatus implementing the present application is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention. It will be understood that while particular polarity devices, e.g., PMOS, NMOS, PNP or NPN may be illustrated in the figures, alternative polarity devices may be employed by appropriate modification of the circuits.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments. Equally, while the claims are directed to an isolated gate drive or reset circuit for same, the application is not to be construed as being so limited and extends to a method for doing same. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. An isolated drive circuit for controlling the operation of a power switch using a single transformer having a primary winding and a secondary winding, the isolated drive circuit comprising:
   a control circuit for providing an output to switch the power switch in response to control signals delivered as one or more pulses from the secondary winding of the transformer, wherein the control circuit is configured to control the power switch in response to the detection of a transition of the one or more delivered pulses, wherein the control circuit is configured as floating circuit; and
   a demodulator for extracting information from the one or more delivered pulses for use by the control circuit, wherein the demodulator extracts information presented as amplitude in the pulses.

2. The isolated drive circuit according to claim 1, wherein the information extracted is employed to set a parameter within the control circuit.

* * * * *